United States Patent
Li et al.

(10) Patent No.: US 9,153,645 B2
(45) Date of Patent: Oct. 6, 2015

(54) LATTICE-MISMATCHED SEMICONDUCTOR STRUCTURES WITH REDUCED DISLOCATION DEFECT DENSITIES AND RELATED METHODS FOR DEVICE FABRICATION

(75) Inventors: Jizhong Li, Bordentown, NJ (US); Anthony J. Lochtefeld, Ipswich, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2022 days.

(21) Appl. No.: 12/180,254

(22) Filed: Jul. 25, 2008

(65) Prior Publication Data

US 2009/0039361 A1 Feb. 12, 2009

Related U.S. Application Data

(63) Continuation-in-part of application No. 11/436,198, filed on May 17, 2006, now abandoned.

(60) Provisional application No. 60/681,940, filed on May 17, 2005.

(51) Int. Cl.
| | |
|---|---|
| H01L 21/20 | (2006.01) |
| H01L 29/10 | (2006.01) |
| H01L 21/02 | (2006.01) |
| H01L 21/8238 | (2006.01) |
| H01L 21/8252 | (2006.01) |
| H01L 21/8258 | (2006.01) |

(Continued)

(52) U.S. Cl.
CPC ...... *H01L 29/1054* (2013.01); *H01L 21/02381* (2013.01); *H01L 21/02433* (2013.01); *H01L 21/02521* (2013.01); *H01L 21/02609* (2013.01); *H01L 21/02639* (2013.01); *H01L 21/02647* (2013.01); *H01L 21/8252* (2013.01); *H01L 21/8258* (2013.01); *H01L 21/823807* (2013.01); *H01L 27/0605* (2013.01); *H01L 29/66795* (2013.01); *H01L 21/7624* (2013.01); *H01L 29/045* (2013.01); *H01L 29/785* (2013.01)

(58) Field of Classification Search
USPC .......................................... 438/478, 481, 483
See application file for complete search history.

(56) References Cited

U.S. PATENT DOCUMENTS

| | | |
|---|---|---|
| 4,545,109 A | 10/1985 | Reichert |
| 4,551,394 A | 11/1985 | Betsch et al. |

(Continued)

FOREIGN PATENT DOCUMENTS

| | | |
|---|---|---|
| DE | 103 20 160 A1 | 8/2004 |
| EP | 1 551 063 | 7/2005 |

(Continued)

OTHER PUBLICATIONS

"Epitaxial Lateral Overgrowth of GaAs on a Si Substrate," *Jnp. J. Appl. Phys.*, vol. 28, No. 3 (Mar. 1989), pp. 337-339.

(Continued)

*Primary Examiner* — Julia Slutsker
(74) *Attorney, Agent, or Firm* — Slater & Matsil, L.L.P.

(57) ABSTRACT

A method of forming a semiconductor structure includes forming an opening in a dielectric layer, forming a recess in an exposed part of a substrate, and forming a lattice-mismatched crystalline semiconductor material in the recess and opening.

15 Claims, 24 Drawing Sheets

(51) Int. Cl.
*H01L 27/06* (2006.01)
*H01L 29/66* (2006.01)
*H01L 21/762* (2006.01)
*H01L 29/04* (2006.01)
*H01L 29/78* (2006.01)

(56) References Cited

U.S. PATENT DOCUMENTS

| | | | |
|---|---|---|---|
| 4,651,179 A | 3/1987 | Reichert | |
| 4,727,047 A | 2/1988 | Bozler et al. | |
| 4,774,205 A | 9/1988 | Choi et al. | |
| 4,789,643 A | 12/1988 | Kajikawa et al. | |
| 4,826,784 A | 5/1989 | Salerno et al. | |
| 4,860,081 A | 8/1989 | Cogan | |
| 4,948,456 A | 8/1990 | Schubert | |
| 5,032,893 A | 7/1991 | Fitzgerald, Jr. et al. | |
| 5,034,337 A | 7/1991 | Mosher et al. | |
| 5,061,644 A | 10/1991 | Yue et al. | |
| 5,091,333 A | 2/1992 | Fan et al. | |
| 5,091,767 A | 2/1992 | Bean et al. | |
| 5,093,699 A | 3/1992 | Weichold et al. | |
| 5,105,247 A | 4/1992 | Cavanaugh | |
| 5,156,995 A | 10/1992 | Fitzgerald, Jr. et al. | |
| 5,166,767 A | 11/1992 | Kapoor et al. | |
| 5,236,546 A | 8/1993 | Mizutani et al. | |
| 5,238,869 A | 8/1993 | Shichijo et al. | |
| 5,256,594 A | 10/1993 | Wu et al. | |
| 5,269,876 A | 12/1993 | Mizutani et al. | |
| 5,281,283 A | 1/1994 | Tokunaga et al. | |
| 5,285,086 A | 2/1994 | Fitzgerald, Jr. | |
| 5,295,150 A | 3/1994 | Vangieson et al. | |
| 5,403,751 A | 4/1995 | Nishida et al. | |
| 5,417,180 A | 5/1995 | Nakamura et al. | |
| 5,427,976 A | 6/1995 | Koh et al. | |
| 5,432,120 A | 7/1995 | Meister et al. | |
| 5,438,018 A | 8/1995 | Mori et al. | |
| 5,518,953 A | 5/1996 | Takasu et al. | |
| 5,589,696 A | 12/1996 | Baba et al. | |
| 5,621,227 A | 4/1997 | Joshi | |
| 5,640,022 A | 6/1997 | Inai et al. | |
| 5,710,436 A | 1/1998 | Tanamoto et al. | |
| 5,717,709 A | 2/1998 | Sasaki et al. | |
| 5,792,679 A | 8/1998 | Nakato | |
| 5,825,049 A | 10/1998 | Simmons et al. | |
| 5,849,077 A | 12/1998 | Kenney | |
| 5,886,385 A | 3/1999 | Arisumi et al. | |
| 5,953,361 A | 9/1999 | Borchert et al. | |
| 5,966,620 A | 10/1999 | Sakaguchi et al. | |
| 6,011,271 A | 1/2000 | Sakuma et al. | |
| 6,015,979 A | 1/2000 | Sugiura et al. | |
| 6,049,098 A | 4/2000 | Sato et al. | |
| 6,100,106 A | 8/2000 | Yamaguchi et al. | |
| 6,111,288 A | 8/2000 | Watanabe et al. | |
| 6,191,432 B1 | 2/2001 | Sugiyama et al. | |
| 6,228,691 B1 | 5/2001 | Doyle | |
| 6,235,547 B1 | 5/2001 | Sakuma et al. | |
| 6,252,261 B1 | 6/2001 | Usui et al. | |
| 6,271,551 B1 | 8/2001 | Schmitz et al. | |
| 6,320,220 B1 | 11/2001 | Watanabe et al. | |
| 6,342,404 B1 | 1/2002 | Shibata et al. | |
| 6,348,096 B1 | 2/2002 | Sunakawa et al. | |
| 6,362,071 B1 | 3/2002 | Nguyen et al. | |
| 6,407,425 B1 | 6/2002 | Babcock et al. | |
| 6,492,216 B1 | 12/2002 | Yeo et al. | |
| 6,500,257 B1 * | 12/2002 | Wang et al. | 117/95 |
| 6,512,252 B1 | 1/2003 | Takagi et al. | |
| 6,521,514 B1 | 2/2003 | Gehrke et al. | |
| 6,576,532 B1 | 6/2003 | Jones et al. | |
| 6,579,463 B1 | 6/2003 | Winningham et al. | |
| 6,603,172 B1 | 8/2003 | Segawa et al. | |
| 6,617,643 B1 | 9/2003 | Goodwin-Johansson | |
| 6,635,110 B1 | 10/2003 | Luan et al. | |
| 6,686,245 B1 | 2/2004 | Mathew et al. | |
| 6,710,368 B2 | 3/2004 | Fisher et al. | |
| 6,720,196 B2 | 4/2004 | Kunisato et al. | |
| 6,727,523 B2 | 4/2004 | Morita et al. | |
| 6,753,555 B2 | 6/2004 | Takagi et al. | |
| 6,784,074 B2 | 8/2004 | Shchukin et al. | |
| 6,803,598 B1 | 10/2004 | Berger et al. | |
| 6,809,351 B2 | 10/2004 | Kuramoto et al. | |
| 6,812,495 B2 | 11/2004 | Wada et al. | |
| 6,815,241 B2 | 11/2004 | Wang et al. | |
| 6,825,534 B2 | 11/2004 | Chen et al. | |
| 6,835,246 B2 | 12/2004 | Zaidi | |
| 6,835,618 B1 | 12/2004 | Dakshina-Murthy et al. | |
| 6,841,410 B2 | 1/2005 | Sasaoka et al. | |
| 6,841,808 B2 | 1/2005 | Shibata et al. | |
| 6,855,583 B1 | 2/2005 | Krivokapic et al. | |
| 6,855,990 B2 | 2/2005 | Yeo et al. | |
| 6,867,433 B2 | 3/2005 | Yeo et al. | |
| 6,873,009 B2 | 3/2005 | Hisamoto et al. | |
| 6,887,773 B2 | 5/2005 | Gunn, III et al. | |
| 6,900,070 B2 | 5/2005 | Craven et al. | |
| 6,902,965 B2 | 6/2005 | Ge et al. | |
| 6,917,068 B1 | 7/2005 | Krivokapic | |
| 6,919,258 B2 | 7/2005 | Grant et al. | |
| 6,920,159 B2 | 7/2005 | Sidorin et al. | |
| 6,921,673 B2 | 7/2005 | Kobayashi et al. | |
| 6,946,683 B2 | 9/2005 | Sano et al. | |
| 6,955,977 B2 | 10/2005 | Kong et al. | |
| 6,958,254 B2 | 10/2005 | Seifert et al. | |
| 6,960,781 B2 | 11/2005 | Currie et al. | |
| 6,982,204 B2 | 1/2006 | Saxler et al. | |
| 6,982,435 B2 | 1/2006 | Shibata et al. | |
| 6,984,571 B1 | 1/2006 | Enquist | |
| 6,991,998 B2 | 1/2006 | Bedell et al. | |
| 6,994,751 B2 | 2/2006 | Hata et al. | |
| 6,995,430 B2 | 2/2006 | Langdo et al. | |
| 6,995,456 B2 | 2/2006 | Nowak | |
| 6,998,684 B2 | 2/2006 | Anderson et al. | |
| 7,001,804 B2 | 2/2006 | Dietz et al. | |
| 7,012,298 B1 | 3/2006 | Krivokapic | |
| 7,012,314 B2 | 3/2006 | Bude et al. | |
| 7,015,497 B1 | 3/2006 | Berger | |
| 7,015,517 B2 | 3/2006 | Grant et al. | |
| 7,033,436 B2 | 4/2006 | Biwa et al. | |
| 7,033,936 B1 | 4/2006 | Green et al. | |
| 7,041,178 B2 | 5/2006 | Tong et al. | |
| 7,049,627 B2 | 5/2006 | Vineis et al. | |
| 7,074,623 B2 | 7/2006 | Lochtefeld et al. | |
| 7,078,731 B2 | 7/2006 | D'Evelyn et al. | |
| 7,084,051 B2 | 8/2006 | Ueda et al. | |
| 7,084,441 B2 | 8/2006 | Saxler | |
| 7,087,965 B2 | 8/2006 | Chan et al. | |
| 7,095,043 B2 | 8/2006 | Oda et al. | |
| 7,098,508 B2 | 8/2006 | Ieong et al. | |
| 7,101,444 B2 | 9/2006 | Shchukin et al. | |
| 7,109,516 B2 | 9/2006 | Langdo et al. | |
| 7,119,402 B2 | 10/2006 | Kinoshita et al. | |
| 7,125,785 B2 | 10/2006 | Cohen et al. | |
| 7,128,846 B2 | 10/2006 | Nishijima et al. | |
| 7,132,691 B1 | 11/2006 | Tanabe et al. | |
| 7,138,292 B2 | 11/2006 | Mirabedini et al. | |
| 7,160,753 B2 | 1/2007 | Williams, Jr. | |
| 7,195,993 B2 | 3/2007 | Zheleva et al. | |
| 7,205,586 B2 | 4/2007 | Takagi et al. | |
| 7,211,864 B2 | 5/2007 | Seliskar | |
| 7,224,033 B2 | 5/2007 | Zhu et al. | |
| 7,244,958 B2 | 7/2007 | Shang et al. | |
| 7,247,534 B2 | 7/2007 | Chidambarrao et al. | |
| 7,247,912 B2 | 7/2007 | Zhu et al. | |
| 7,250,359 B2 | 7/2007 | Fitzgerald | |
| 7,262,117 B1 | 8/2007 | Gunn, III et al. | |
| 7,268,058 B2 | 9/2007 | Chau et al. | |
| 7,344,942 B2 | 3/2008 | Korber | |
| 2001/0006249 A1 * | 7/2001 | Fitzgerald | 257/613 |
| 2001/0045604 A1 | 11/2001 | Oda et al. | |
| 2002/0030246 A1 | 3/2002 | Eisenbeiser et al. | |
| 2002/0066403 A1 | 6/2002 | Sunakawa et al. | |
| 2003/0045017 A1 | 3/2003 | Hiramatsu et al. | |
| 2003/0064535 A1 | 4/2003 | Kub et al. | |
| 2003/0087462 A1 | 5/2003 | Koide et al. | |
| 2003/0089899 A1 | 5/2003 | Lieber et al. | |
| 2003/0155586 A1 | 8/2003 | Koide et al. | |

(56) References Cited

U.S. PATENT DOCUMENTS

| | | |
|---|---|---|
| 2003/0168002 A1* | 9/2003 | Zaidi .......................... 117/101 |
| 2003/0203531 A1 | 10/2003 | Shchukin et al. |
| 2003/0207518 A1 | 11/2003 | Kong et al. |
| 2004/0012037 A1 | 1/2004 | Venkatesan et al. |
| 2004/0043584 A1* | 3/2004 | Thomas et al. ............... 438/507 |
| 2004/0072410 A1 | 4/2004 | Motoki et al. |
| 2004/0075105 A1 | 4/2004 | Leitz et al. |
| 2005/0003572 A1 | 1/2005 | Hahn et al. |
| 2005/0045983 A1 | 3/2005 | Noda et al. |
| 2005/0054180 A1 | 3/2005 | Han et al. |
| 2005/0056892 A1 | 3/2005 | Seliskar |
| 2005/0073028 A1 | 4/2005 | Grant et al. |
| 2005/0093021 A1 | 5/2005 | Ouyang et al. |
| 2005/0104156 A1 | 5/2005 | Wasshuber |
| 2005/0118825 A1 | 6/2005 | Nishijima et al. |
| 2005/0145941 A1 | 7/2005 | Bedell et al. |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0212051 A1 | 9/2005 | Jozwiak et al. |
| 2005/0217565 A1 | 10/2005 | Lahreche et al. |
| 2005/0280103 A1 | 12/2005 | Langdo et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0057825 A1 | 3/2006 | Bude et al. |
| 2006/0105533 A1 | 5/2006 | Chong et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0145264 A1 | 7/2006 | Chidambarrao et al. |
| 2006/0160291 A1 | 7/2006 | Lee et al. |
| 2006/0166437 A1 | 7/2006 | Korber |
| 2006/0169987 A1* | 8/2006 | Miura et al. .................... 257/79 |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0267047 A1 | 11/2006 | Murayama |
| 2006/0292719 A1 | 12/2006 | Lochtefeld et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0196987 A1 | 8/2007 | Chidambarrao et al. |
| 2007/0267722 A1 | 11/2007 | Lochtefeld et al. |
| 2008/0001169 A1 | 1/2008 | Lochtefeld |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0187018 A1 | 8/2008 | Li |

FOREIGN PATENT DOCUMENTS

| | | |
|---|---|---|
| EP | 1 796 180 | 6/2007 |
| JP | 2-62090 | 3/1990 |
| JP | 2000-286449 | 10/2000 |
| JP | 2004-200375 | 7/2004 |
| WO | WO-02/086952 | 10/2002 |
| WO | WO-2004/023536 | 3/2004 |
| WO | WO-2005/013375 | 2/2005 |
| WO | WO-2005/048330 | 5/2005 |
| WO | WO-2005/098963 | 10/2005 |
| WO | WO-2005/122267 | 12/2005 |
| WO | WO-2006/125040 | 11/2006 |

OTHER PUBLICATIONS

68 *Appl. Phys. Letters* 7, pp. 774-779 (1999).

Asano, T. et al, "AlGaInN laser diodes grown on an ELO-GaN substrate vs. on a sapphire substrate," 2000 *IEEE Semiconductor Laser Conf., Conf. Digest*, pp. 109-110.

Ashby, C.I.H. et al, "Low-dislocation-density GaN from a single growth on a textured substrate," *Appl. Phys. Letters*, v. 77, n. 20, Nov. 13, 2000, pp. 3233-3235.

Bakkers et al, "Epitaxial Growth on InP Nanowires on Germanium," *Nature Materials*, vol. 3 (Nov. 2004), pp. 769-773.

Baron et al, "Chemical Vapor Deposition of Ge Nanocrystals on $SiO_2$," *Appl. Phys. Letters*, vol. 83, No. 7 (Aug. 18, 2003), pp. 1444-1446.

Bean et al, "GexSi1-x/Si strained-later superlattice grown by molecular beam epitaxy," *J. Vac. Sci. Tech. A* (2)2, pp. 436-440 (1984).

Beckett et al, "Towards a reconfigurable nanocomputer platform," *ACM Int'l. Conf. Proceeding Series*, vol. 19, pp. 141-150 (2002).

Beltz et al, "A Theoretical Model for Threading Dislocation Reduction During Selective Area Growth," *Materials Sci. and Engineering*, A234-236 (1997), pp. 794-797.

Bergman et al, "RTD/CMOS Nanoelectronic Circuits: Thin-Film InP-based Resonant Tunneling Diodes Integrated with CMOS circuits," 20 *Electron Device Letters* 3, pp. 119-122 (1999).

Blakeslee, "The Use of Superlattices to Block the Propogation of Dislocations in Semiconductors," *Mat. Res. Soc. Symp. Proc.* 148, pp. 217-227.

Borland, J.O., "Novel device structures by selective epitaxial growth (SEG)," *Electron Devices Meeting, 1987 Int'l.*, vol. 33, pp. 12-15, 1987.

Bryskiewicz, T., "Dislocation filtering in SiGe and InGaAs buffer layers grown by selective lateral overgrowth method," *Appl. Phys. Letters*, v. 66, n. 10, Mar. 6, 1995, pp. 1237-1239.

Bushroa, A.R.; Jacob, C.; Saijo, H.; Nishino, S. "Lateral epitaxial overgrowth and reduction in defect density of 3C-SiC on patterned Si substrates," *J. Crystal Growth*, v. 271, n. 1-2, Oct. 15, 2004, pp. 200-206.

Cannon et al, "Monolithic Si-based Technology for Optical Receiver Circuits," *Proceedings of SPIE*, vol. 4999 (2003), pp. 145-155.

Chan et al, "Influence of Metalorganic Sources on the Composition Uniformity of Selectively Grown $Ga_xIn_{1-x}P$," *Jpn. J. Appl. Phys.*, vol. 33 (1994) pp. 4812-4819.

Chang et al, "Epitaxial Lateral Overgrowth of Wide Dislocation-free GaAs on Si Substrates," *Electrochemical Society Proceedings*, vol. 97-21, pp. 196-200.

Chang, et al, "Effect of growth temperature on epitaxial lateral overgrowth of GaAs on Si substrate," *J. Crystal Growth*, v. 174, n. 1-4, Apr. 1997, pp. 630-704.

Chau et al, "Opportunities and Challenges of III-V Nanoelectronics for Future High-Speed, Low Power Logic Applications," *IEEE CSIC Digest*, (2005) pp. 17-20.

Chen, Y. et al, "Dislocation reduction in GaN thin films via lateral overgrowth from trenches," *Appl. Phys. Letters*, v. 75, n. 14, Oct. 4, 1999, pp. 2062-2063.

Choi et al, "Monolithic Integration of GaAs/AlGaAs Double-Heterostructure LED's and Si MOSFET's," *Electon Device Letters*, v. EDL-7, No. 9 (1986).

Choi et al, "Monolithic Integration of GaAs/AlGaAs LED and Si Driver Circuit," 9 *Electron Device Letters* 10 (1988).

Choi et al, "Monolithic Integration of Si MOSFET's and GaAs MESFET's," *Electron Device Letters*, v. EDL-7, No. 4 (1986).

Cloutier et al, "Optical gain and stimulated emission in periodic nanopatterned crystalline silicon," *Nature Materials*, Nov. 2005.

Currie et al, "Carrier Mobilities and Process Stability of Strained Si n- and p-MOSFETs on SiGe Virtual Substrates," *J. Vac. Sci. Tech. B* 19(6), pp. 2268-2279 (2001).

(56) References Cited

OTHER PUBLICATIONS

Dadgar et al, "MOVPE Growth of GaN on Si (111) Substrates," *J. Crystal Growth*, 248 (2003) pp. 556-562.
Datta et al, "Silicon and III-V Nanoelectronics," *IEEE Int'l. Conf. on Indium Phosphide & Related Mat.*, pp. 7-8 (2005).
Davis, R.F. et al, "Lateral epitaxial overgrowth of and defect reduction in GaN thin films," *1998 IEEE Lasers and Electro-Optics Society Annual Meeting*, pp. 360-361.
de Boeck et al, "The Fabrication of a Novel Composite GaAs/SiO2 Nucleation Layer on Silicon for Heteroepitaxial Overgrowth by Molecular Beam Epitaxy," *Materials Science and Engineering, B9* (1991) pp. 137-141.
Donaton et al, "Design and Fabrication of MOSFETs with a Reverse Embedded SiGe (Rev. e-SiGe) Structure," 2006 *IEDM*, pp. 465-468.
Dong, Y., et al, "Selective area growth of InP through narrow openings by MOCVD and its application to InP HBT," *2003 Int'l. Conf. on Indium Phosphide and Related Materials*, pp. 389-392, May 12-16, 2003.
Dong-Ho et al, "GaN nano epitaxial lateral overgrowth on holographically patterned," *2003 Int'l. Symposium on Compound Semiconductors*, pp. 27-28, Aug. 25-27, 2003.
Examination Report in European Patent Application No. 06800414.2, mailed Mar. 5, 2009 (3 pages).
Fang et al, "Electrically pumped hybrid AlGaInAs-silicon evanescent laser," 14 *Optics Express 20*, pp. 9203-9210 (2006).
Feltin, E. et al, "Epitaxial lateral overgrowth of GaN on Si (111)," *J Appl. Phys.*, v. 93, n. 1, Jan. 1, 2003, p. 182-185.
Feng et al, "Integration of Germanium-on-Insulator and Silicon MOSFETs on a Silicon Substrate," 27 *Electron Device Letters* 11, pp. 911-913 (2006).
Fiorenza et al, "Film Thickness Constraints for Manufacturable Strained Silicon CMOS," 19 *Semiconductor Sci. Technol.*, pp. L4 (2004).
Fischer et al, "Elastic stress relaxation in SiGe epilayers on patterned Si substrates," 75 *J. Appl. Phys.* 1, pp. 657-659 (1994).
Fischer et al, "State of stress and critical thickness of Strained small-area SiGe layers," *Phys. Stat. Sol.* (a) 171, pp. 475-485 (1999).
Fitzgerald et al, "Elimination of Dislocations in Heteroepitaxial MBE and RTCVD $Ge_xSi_{1-x}$ Grown on Patterned Si Substrates," *J. Electronic Materials*, vol. 19, No. 9 (1990), pp. 949-955.
Fitzgerald et al, "Epitaxial Necking in GaAs Growth on Pre-patterned Si Substrates," *J. Electronic Materials*, vol. 20, No. 10 (1991), pp. 839-853.
Fitzgerald et al, "Nucleation Mechanisms and the Elimination of Misfit Dislocations at Mismatched Interfaces by Reduction in Growth Areas," *J. Appl. Phys.*, vol. 65, No. 6, (Mar. 15, 1989), pp. 2220-2237.
Fitzgerald et al, "Structure and recombination in InGaAs/GaAs heterostructures," 63 *J. Appl. Phys.* 3, pp. 693-703 (1988).
Fitzgerald et al, "Totally relaxed GexSi1-x layers with low threading dislocation densities grown on Si Substrates," 59 *Appl. Phys. Letters* 7, pp. 811-813 (1991).
Fitzgerald, "The Effect of Substrate Growth Area on Misfit and Threading Dislocation Densities in Mismatched Heterostructures," *J. Vac. Sci. Technol.*, vol. 7, No. 4 (Jul./Aug. 1989), pp. 782-788.
Gallagher et al, "Development of the magnetic tunnel junction MRAM at IBM: From first junctions to a 16-Mb MRAM demonstrator chip," 50 IBM *J. Research & Dev.* 1 (2006).
Gallas et al, "Influence of Doping on Facet Formation at the SiO2/Si Interface," *Surface Sci.* 440, pp. 41-48 (1999).
Geppert, L., "Quantum transistors: toward nanoelectronics," *IEEE Spectrum*, pp. 46-51 (Sep. 2000).
Gibbon et al, "Selective-area low-pressure MOCVD of GaInAsP and related materials on planar InP substrates" *Semicond Sci Tech*. 8, pp. 998-1010 (1993).
Glew et al, "New DFB grating structure using dopant-induced refractive index step," *J. Crystal Growth* 261 (2004) pp. 349-354.
Gould et al, "Magnetic resonant tunneling diodes as voltage-controlled spin selectors," 241 *Phys. Stat. Sol.* (B) 3, pp. 700-703 (2004).

Groenert et al, "Monolithic integration of room-temperature cw GaAs/AlGaAs lasers on Si substrates via relaxed graded GeSi buffer layers," 93 *J. Appl. Phys.* 362 (2003).
Gustafsson et al, "Cathodoluminescence from Relaxed $Ge_xSi_{1-x}$ Grown by Heteroepitaxial Lateral Overgrowth," *J. Crystal Growth*, vol. 141 (1994), pp. 363-370.
Gustafsson et al, "Investigation of High Quality $Ge_xSi1-x$ Grown on Heteroepitaxial Lateral Overgrowth Using Cathodoluminescence," *Inst. Phys. Conf. Ser.*, No. 134 (Apr. 1993), pp. 675-678.
Hayafuji et al, *Jpn. J. Appl. Phys.* 29, pp. 2371 (1990).
Hersee, et al, "The Controlled Growth of GaN Nanowires," *Nano Letters*, vol. 6, No. 8 (2006), pp. 1808-1811.
Hiramatsu, K. et al, "Fabrication and characterization of low defect density GaN using facet-controlled epitaxial lateral overgrowth (FACELO)," *J. Crystal Growth*, v. 221, Dec. 2000, p. 316-326.
Hollander et al, "Strain and Misfit Dislocation Density in Finite Lateral Size $Si_{1-x}Ge_x$ Films Grown by Selective Epitaxy," *Thin Solid Films*, vol. 292, (1997) pp. 213-217.
Hu et al, "Growth of Well-Aligned Carbon Nanotube arrays on Silicon Substrates using Porous Alumina Film as a Nanotemplate," 79 *App. Phys. Letters* 19 (2001).
Huang et al, "Electron and Hole Mobility Enhancement in Strained SOI by Wafer Bonding," 49 *IEEE Trans. on Electron Devices* 9, pp. 1566-1570 (2002).
International Preliminary Report on Patentability for International Application No. PCT/US07/020777, mailed Apr. 9, 2009 (12 pages).
International Preliminary Report on Patentability for International Application No. PCT/US2006/019152, dated Nov. 20, 2007.
International Preliminary Report on Patentability for International Application No. PCT/US2007/019568, mailed Mar. 10, 2009 (7 pages).
International Preliminary Report on Patentability for International Application No. PCT/US07/021023, mailed Apr. 9, 2009.
International Preliminary Report on Patentability for International Application No. PCT/US2007/020181, mailed Apr. 2, 2009.
International Search Report and Written Opinion for International Application No. PCT/US02/022392, mailed Apr. 11, 2008.
International Search report and Written Opinion for International Application No. PCT/US07/020777, mailed Feb. 8, 2008.
International Search Report and Written Opinion for International Application No. PCT/US2006/019152, dated Oct. 19, 2006.
International Search Report and Written Opinion for International Application No. PCT/US2007/019568, mailed Feb. 6, 2008.
International Search Report and Written Opinion for International Application No. PCT/US2007/020181, dated Jan. 25, 2008.
International Search Report and Written Opinion for International Application PCT/US2007/007373, dated Oct. 5, 2007.
International Search Report and Written Opinion for Patent Application No. PCT/US2006/029247, dated May 7, 2007.
International Search Report and Written Opinion for Patent Application No. PCT/US2006/033859, dated Sep. 12, 2007.
International Search Report for Patent Application No. PCT/US2006/019152, dated May 17, 2005.
International Technology Roadmap for Semiconductors-Front End Processes, pp. 1-62 (2005).
Ipri, et al, "MONO/POLY technology for fabricating low-capacitance CMOS integrated circuits," *IEEE Transactions on Electron Devices*, vol. 35, No. 8pp.1382-1383, Aug. 1988.
IPRP for International Application No. PCT/US2006/029247, mailed Feb. 7, 2008.
IPRP for International Application No. PCT/US2006/033859, mailed Mar. 20, 2008.
Ishitani et al, "Facet Formation in Selective Silicon Epitaxial Growth," 24 *Jpn. J. Appl. Phys.* 10, pp. 1267-1269 (1985).
Ismail et al, "High-quality GaAs on sawtooth-patterned Si substrates," 59 *Appl. Phys. Letters* 19, pp. 2418-2420 (1991).
Jain et al, "Stresses in strained GeSi stripes and quantum structures: calculation using the finite element method and determination using micro-Raman and other measurements," *Thin Solid Films* 292 (1997) pp. 218-226.
Ju, W. et al, "Epitaxial lateral overgrowth of gallium nitride on silicon substrate," *J. Crystal Growth*, v. 263, n. 1-4, Mar. 1, 2004, pp. 30-34.

(56) References Cited

OTHER PUBLICATIONS

Kamiyama, S., et al, "UV laser diode with 350.9-nm-lasing wavelength grown by hetero-epitaxial-lateral overgrowth technology," *IEEE Journal of Selected Topics in Quantum Electronics*, vol. 11, No. 5 pp. 1069-1073, Sep.-Oct. 2005.

Kamiyama, S., et al, "UV light-emitting diode fabricated on hetero-ELO-grown Al0.22Ga0.78N with low dislocation density," *Physica Status Solidi A*, v. 192, n. 2, Aug. 2002, p. 296-300.

Kazi et al, "Realization of GaAs/AlGaAs Lasers on Si Substrates Using Epitaxial Lateral Overgrowth by Metalorganic Chemical Vapor Deposition," *Jpn. J. Appl. Phys.*, vol. 40 (2001), pp. 4903-4906.

Kidoguchi, I. et al, "Air-bridged lateral epitaxial overgrowth of GaN thin films," *Appl. Phys. Letters*, v. 76, n. 25, Jun. 19, 2000, p. 3768-3770.

Kimura et al, "Vibronic Fine Structure Found in the Blue Luminescence from Silicon Nanocolloids," *Jpn. J. Appl. Phys.*, vol. 38 (1999), pp. 609-612.

Klapper, "Generation and Propagation of Dislocations During Crystal Growth," *Mat. Chem. and Phys.* 66, pp. 101-109 (2000).

Knall et al, Threading Dislocations in GaAs Grown with Free Sidewalls on Si mesas, *J. Vac. Sci. Technol. B*, vol. 12, No. 6, (Nov./Dec. 1994) pp. 3069-3074.

Krost et al, "GaN-based Optoelectronics on Silicon Substrates," *Materials Science & Engineering*, B93 (2002) pp. 77-84.

Kushida, K., et al, "Epitaxial growth of $PbTiO_3$ films on $SrTiO_3$ by RF magnetron sputtering," *Ultrasonics, IEEE Transactions on Ferroelectrics and Frequency Control*, vol. 38, No. 6 pp. 656-662, Nov. 1991.

Kwok K Ng, *Complete Guide to Semiconductor Devices*, 2nd ed., Chapter 18 (2002).

Langdo et al, "High Quality Ge on Si by Epitaxial Necking," *Appl. Phys. Letters*, vol. 76, No. 25, (Jun. 19, 2000), pp. 3700-3702.

Langdo, "Selective SiGe Nanostructures," Ph.D. Thesis, Massachusetts Institute of Technology (2001).

Lee et al, "Strained-relieved, Dislocation-free $In_xGa_{1-x}As$/GaAs(001) Heterostructure by Nanoscale-patterned Growth," *Appl. Phys. Letters*, vol. 85, No. 18 (Nov. 1, 2004), pp. 4181-4183.

Lee, S.C. et al, "Growth of GaN on a nanoscale periodic faceted Si substrate by metal organic vapor phase epitaxy," 2003 *Int'l. Symposium on Compound Semiconductors: Post-Conf. Proceedings*, pp. 15-21, Aug. 25-27, 2003.

Li et al, "Heteropitaxy of High-quality Ge on Si by Nanoscale Ge seeds Grown through a Thin Layer of $SiO_2$," *Appl. Phys. Letters*, vol. 85, No. 11 (Sep. 13, 2004), pp. 1928-1930.

Li et al, "Morphological Evolution and Strain Relaxation of Ge Islands Grown on Chemically Oxidized Si(100) by Molecular-beam Epitaxy," *J. Appl. Phys.*, vol. 98, (2005), pp. 073504-1-073504-8.

Li et al, "Selective Growth of Ge on Si(100) through Vias of $SiO_2$ Nanotemplate Using Solid Source Molecular Beam Epitaxy," *Appl. Phys. Letters*, vol. 83, No. 24 (Dec. 15, 2003), pp. 5032-5034.

Liang et al, "Critical Thickness Enhancement of Epitaxial SiGe films Grown on Small Structures," *J. Appl. Phys.*, vol. 97, (2005) pp. 043519-1-043519-7.

Lim et al, "Facet Evolution in Selective Epitaxial Growth of Si by cold-wall ultrahigh vacuum chemical vapor deposition," *J. Vac. Sci. Tech. B* 22(2), p. 682 (2004).

Liu et al, "High Quality Single-crystal Ge on Insulator by Liquid-phase Epitaxy on Si Substrates," *Appl. Phys. Letters*, vol. 84, No. 14, (Apr. 4, 2004) pp. 2563-2565.

Liu et al, "Rapid Melt Growth of Germanium Crystals with Self-Aligned Microcrucibles on Si Substrates," *J. Electrochemical Society*, vol. 152, No. 8, (2005) G688-G693.

Loo et al, "Successful Selective Epitaxial $Si_{1-x}Ge_x$ Deposition Process for HBT-BiCMOS and high Mobility Heterojunction pMOS Applications," 150 *J. Electrochem. Soc'y* 10, pp. G638-G647 (2003).

Lourdudoss, S. et al; "Semi-insulating epitaxial layers for optoelectronic devices," 2000 *IEEE Int'l. Semiconducting and Insulating Materials Conf.*, vol., no.pp. 171-178, 2000.

Luan et al, "High-quality Ge Epilayers on Si with LowThreading-dislocation Densities," *Appl. Phsics. Letters*, vol. 75, No. 19, (Nov. 8, 1999) pp. 2909-2911.

Luan, "Ge Photodectors for Si Microphotonics," Ph.D. Thesis, Massachusetts Institute of Technology, Department of Materials Science & Engineering (Jan. 12, 2001).

Lubnow et al, "Effect of III/V-Compound Epitaxy on Si Metal-Oxide-Semiconductor Circuits," *Jpn. J. Appl. Phys.*, vol. 33 (1994) pp. 3628-3634.

Luryi et al, "New Approach to the High Quality Epitaxial Growth of Latticed-mismatched Materials," *Appl. Phys. Lett.*, vol. 49, No. 3, (Jul. 21, 1986) 140-42.

Martinez et al, "Characterization of GaAs Conformal Layers Grown by Hydride Vapour Phase Epitaxy on Si Substrates by Microphotoluminescence Cathodoluminescence and microRaman," *J.Crystal Growth*, vol. 210 (2000) pp. 198-202.

Matsunaga et al, "A New Way to Achieve Dislocation-free Heteroepitaxial Growth by Molecular Beam Epitaxy: Vertical Microchannel Epitaxy," *J. Crystal Growth*, vol. 237-239 (2002) pp. 1460-1465.

Matthews et al, "Defects in Epitaxial Multilayers—Misfit Dislocations," *J. Crystal Growth*, 27, pp. 118-125 (1974).

Monroy et al, "High UV/visible contrast photodiodes based on epitaxial lateral overgrown GaN layers," *Electronics Letters*, vol. 35, No. 17 pp. 1488-1489, Aug. 19, 1999.

Nakano et al, "Epitaxial lateral overgrowth of AlN layers on patterned sapphire substrates," *Physica Status Solidi A*, v. 203, n. 7, May 2006, p. 1632-35.

Nam et al, "Lateral Epitaxy of Low Defect Density GaN Layers via Organometallic Vapor Phase Epitaxy," *Appl. Phys. Letters*, vol. 71, No. 18, (Nov. 3, 1997) pp. 2638-2640.

Naoi et al, "Epitaxial Lateral Overgrowth of GaN on Selected-area Si (111) Substrate with Nitrided Si Mask," *J. Crystal Growth*, vol. 248, (2003) pp. 573-577.

Naritsuka et al, "InP Layer Grown on (001) Silicon Substrate by Epitaxial Lateral Overgrowth," *Jpn. J. Appl. Phys.*, vol. 34 (1995), pp. L1432-L1435.

Naritsuka et al, "Vertical Cavity Surface Emitting Laser Fabricated ON GaAs Laterally Grown ON Si Substrate," *Electrochemical Society Proceedings*, vol. 97-21, pp. 86-90.

Neudeck, et al, "Novel silicon epitaxy for advanced MOSFET devices," 2000 *IEDM Technical Digest*, pp. 169-72.

Neumann et a., "Growth of III V resonant tunneling diode on Si Substrate with LP-MOVPE," *J. of Crystal Growth*, 248, pp. 380-383 (2003).

Norman, A.G. et al, "Characterization of MOCVD lateral epitaxial overgrown III-V semiconductor layers on GaAs substrates," 2003 *Int'l. Symposium on Compound Semiconductors*, pp. 45-46, Aug. 25-27, 2003.

Parillaud et al, "High Quality InP on Si by Conformal Growth," *Appl. Phys. Lett.*, vol. 68, No. 19 (May 6, 1996) pp. 2654-2656.

Park et al, "Growth of Ge Thick Layers on Si(001) Substrates Using Reduced Pressure Chemical Vapor Deposition," 45 *Jpn. J. Appl. Phys.* 11, pp. 8581-8585 (2006).

Partial International Search Report for International Application No. PCT/US2008/068377, mailed Apr. 7, 2009.

Partial International Search for International Application No. PCT/US2006/033859, 7 pages.

Pidin et al, "MOSFET Current Drive Optimization Using Silicon Nitride Capping Layer for 65-nm Technology Node," 2004 *Symp. on VLSI Technology, Dig. Tech. Papers*, pp. 54-55.

Piffault, N., et al, "Assessment of the strain of InP films on Si obtained by HVPE conformal growth," *Sixth Int'l. Conf. on Indium Phosphide and Related Materials, 1994. Conf. Proceedings.*, pp. 155-158, Mar. 27-31, 1994.

Pribat et al, "High Quality GaAs on Si by Conformal Growth," *Appl. Phys. Lett.*, vol. 60, No. 17 (Apr. 27, 1992) pp. 2144-2146.

Prost, W., ed. *QUDOS Technical Report* 2002-2004.

Reed et al, "Realization of a three-terminal resonant tunneling device: the bipolar quantum resonant tunneling transistor," *54 Appl. Phys. Letters 11*, p. 1034 (1989).

(56) References Cited

OTHER PUBLICATIONS

Ren, D. et al, "Low-dislocation-density, nonplanar GaN templates for buried heterostructure lasers grown by lateral epitaxial overgrowth," *Appl. Phys. Letters*, v 86, n 11, Mar. 14, 2005, 111901-1-111901-3.

Rim et al, "Enhanced Hole Mobilities in Surface-channel Strained-Si p-MOSFETs," 1995 *IEDM*, pp. 517-520.

Rim et al, "Fabrication and mobility characteristics of ultra-thin strained Si Directly on Insulator (SSDOI) MOSFETs," 2003 *IEDM Tech. Dig.*, pp. 49-52.

Ringel et al, "Single-junction InGaP/GaAs Solar Cells Grown on Si Substrates with SiGe Buffer Layers," *Prog. Photovolt.: Res. & Appl.* 2002; 10:417-26.

Rosenblad et al, "A Plasma Process for Ultrafast Deposition of SiGe Graded Buffer Layers," 76 *Appl. Phys. Letters* 11, p. 1034 (1989).

Sakai, "Defect Structure in Selectively Grown GaN films with low threading dislocation density," *Appl. Phys. Letters* 71(16), pp. 2259-2261 (1997).

Sakai, "Transmission electron microscopy of defects in GaN films formed by epitaxial lateral overgrowth," 73 *Appl. Phys. Letters* 4, pp. 481-483 (1998).

Sakawa et al, "Effect of Si Doping on Epitaxial Lateral Overgrowth of GaAs on GaAs Coated Si Substrate," *Jpn. J Appl. Phys.*, vol. 31 (1992) pp. 359-361.

Sangwoo Pae et al,, "Multiple layers of silicon-on-insulator islands fabrication by selective epitaxial growth," *IEEE Electron Device Letters*, vol. 20, No. 5 pp. 194-196, May 1999.

Schaub, J.D et al, "Resonant-cavity-enhanced high-speed Si photodiode grown by epitaxial lateral overgrowth," *IEEE Photonics Technology Letters*, vol. 11, No. 12 pp. 1647-1649, Dec. 1999.

Seabaugh et al, "Promise of Tunnel Diode Integrated Circuits," Tunnel Diode and CMOS/HBT Integration Workshop, Dec. 9, 1999, Naval Research Laboratory.

Shahidi, G. et al, "Fabrication of CMOS on ultrathin SOI obtained by epitaxial lateral overgrowth and chemical-mechanical polishing," 1990 *IEDM Techinical Digest.* pp. 587-590.

Shichijo et al, "Co-Integration of GaAs MESFET & Si CMOS Circuits," 9 *Elec. Device Letters* 9 (1988).

Siekkinen, J.W. et al, "Selective epitaxial growth silicon bipolar transistors for material characterization," *IEEE Transactions on Electron Devices*, vol. 35, No. 10 pp. 1640-1644, Oct. 1988.

Su et al, "Catalytic Growth of Group III-nitride Nanowires and Nanostructures by Metalorganic Chemical Vapor Deposition," *Appl. Phys. Letters*, vol. 86 (2005) pp. 013105-1-013105-3.

Su et al, "New planar self-aligned double-gate fully-depleted P-MOSFETs using epitaxial lateral overgrowth (ELO) and selectively grown source/drain (S/D)," 2000 *IEEE Int'l. SOI Conf.*, pp. 110-111.

Sun et al, "Thermal strain in Indium Phosphide on silicon obtained by Epitaxial Lateral Overgrowth," 94 *J. Appl. Phys.* 4, pp. 2746-2748 (2003).

Sun, Y. et al, "Temporally resolved growth of InP in the openings off-oriented from [110] direction," 2000 *Int'l. Conf. on Indium Phosphide and Related Materials, Conf. Proceedings.* pp. 227-230.

Sun, Y.T et al, "Sulfur doped indium phosphide on silicon substrate grown by epitaxial lateral overgrowth," 2004 *Int'l. Conf. on Indium Phosphide and Related Materials*, pp. 334-337.

Sun, Y.T. et al, "InGaAsP multi-quantum wells at 1.5 /spl mu/m wavelength grown on indium phosphide templates on silicon," 2003 *Int'l. Conf. on Indium Phosphide and Related Materials*, pp. 277-280.

Sun, Y.T. et al, "Selective area growth of InP on InP precoated silicon substrate by hydride vapor phase epitaxy," 2002 *Int'l Conf. on Indium Phosphide and Related Materials*, pp. 339-342.

Suryanarayanan, G. et al, "Microstructure of lateral epitaxial overgrown InAs on (100) GaAs substrates," *Appl .Phys. Letters*, v. 83, n .10, Sep. 8, 2003, p. 1977-1979.

Takasuka et al, "AlGaAs/InGaAs DFB Laser by One-Time Selective MOCVD Growth on a Grating Substrate," 43 *Jpn. J. App. Phys.* 4B (2004) pp. 2019-2022.

Takasuka et al, "InGaAs/AlGaAs Quantum Wire DFB Buried HeteroStructure Laser Diode by One-Time Selective MOCVD on Ridge Substrate," 44 *Jpn. J. App. Phys.*, 4B (2005) pp. 2546-2548.

Tamura et al, "Heteroepitaxy on high-quality GaAs on Si for Optical Interconnections on Si Chip," *Proceedings of the SPIE*, vol. 2400, pp. 128-139 (1995).

Tamura et al, "Threading Dislocations in GaAs on Pre-patterned Si and in Post-patterned GaAs on Si," *J. Crystal Growth*, vol. 147, (1995) pp. 264-273.

Tanaka et al, "Structural Characterization of GaN Lateral Overgrown on a (111) Si Substrate," *Appl. Phys. Letters*, vol. 79, No. 7 (Aug. 13, 2001) pp. 955-957.

Thean et al, "Uniaxial-Biaxial Hybridization for Super-Critical Strained-Si Directly on Insulator (SC-SSOI) PMOS with Different Channel Orientations," *IEEE*, pp. 1-4 (2005).

Thompson et al, "A Logic Nanotechnology Featuring Strained-Silicon," 25 *IEEE Electron Device Letters* 4, pp. 191-193 (2004).

Tomiya, S.; Hino, T.; Goto, S.; Takeya, M.; Ikeda, M., "Dislocation related issues in the degradation of GaN-based laser diodes," *IEEE Journal of Selected Topics in Quantum Electronics*, vol. 10, No. 6 pp. 1277-1286, Nov.-Dec. 2004.

Tran et al, "Growth and Characterization of InP on Silicon by MOCVD," *J. Crystal Growth*, vol. 121, (1992) pp. 365-372.

Tsang, W. et al, "The heteroepitaxial ridge-overgrown distributed feedback laser," *IEEE Journal of Quantum Electronics*, vol. 21, No. 6 pp. 519-526, Jun. 1985.

Tsaur, B.-Y. et al, "Low-dislocation-density GaAs epilayers grown on Ge-coated Si substrates by means of lateral epitaxial overgrowth," *Appl. Phys. Letters*, v. 41, n. 4, Aug. 15, 1982, 347-49.

Tseng et al, "Effects of Isolation Materials on Facet Formation for Silicon Selective Epitaxial Growth," 71 *Appl. Phys. Letters* 16, p. 2328 (1997).

Tsuji et al, "Selective Epitaxial Growth of GaAs on Si with Strained Sort-period Superlattices by Molecular Beam Epitaxy under Atomic Hydrogen Irradiation," *J. Vac. Sci. Technol. B.*, vol. 22, No. 3, (May/Jun. 2004) pp. 1428-1431.

Usuda et al, "Strain relaxation of strained-Si layers on SiGe-on-insulator (SGOI) structures after mesa isolation," *Appl. Surface Sci.* 224, pp. 113-116 (2004).

Usui et al, "Thick GaN Epitaxial Growth with Low Dislocation Density by Hydride Vapor Phase Epitazy," 36 *Jpn. J. Appl. Phys.*, pp. L899-L902 (1997).

Vanamu et al, "Epitaxial Growth of High-quality Ge Films on Nanostructured Silicon Substrates," *Appl. Phys. Letters*, vol. 88, (2006) pp. 204104-1-204104-3.

Vanamu et al, "Growth of High Quality Ge/Si$_{1-x}$Ge$_x$ on Nano-scale Patterned Si Structures," *J. Vac. Sci. Techn. B*, vol. 23, No. 4, (Jul./Aug. 2005) pp. 1622-1629.

Vanamu et al, "Heteroepitaxial Growth on Microscale Patterned Silicon Structures," *J. Crystal Growth*, vol. 280, (2005) pp. 66-74.

Vanamu et al, "Improving Ge/Si$_s$Ge$_{1-x}$ Film Quality through Growth onto Patterned Silicon Substrates," *Advances in Electronics Manufacturing Technology*, (Nov. 8, 2004) pp. 1-4.

Ventury et al, "First Demonstration of AlGaN/GaN Heterostructure Field Effect Transistor on a GaN Grown by Lateral Epitaxial Overgrowth (LEO)," *Inst. Phys. Conf. Ser. No.* 162 (1999) pp. 177-183.

Vescan et al, "Lateral confinement by low pressure chemical vapor deposition-based selective epitaxial growth of Si1-xGex/Si nanostructures," 81 *J. Appl. Phys.* 10, pp. 6709-6715 (1997).

Wang, J. et al, "Fabrication of patterned sapphire substrate by wet chemical etching for maskless lateral overgrowth of GaN," *J. Electrochemical Society*, v. 153, n. 3, Mar. 2006, pp. C182-C185.

Wernersson et al, "InAs Epitaxial Lateral growth of W Marks," *J. Crystal Growth*, vol. 280 (2005) pp. 81-86.

Wuu, D.S. et al, "Defect reduction and efficiency improvement of near-ultraviolet emitters via laterally overgrown GaN on a GaN/patterned sapphire template," *Appl. Phys. Letters*, v 89, n 16, Oct. 16, 2006, p. 161105-3.

Xie et al, "From Porous Si to Patterned Si Substrate: Can Misfit Strain Energy in a Continuous Heteroepitaxial Film Be Reduced?" *J. Va. Sci. Technol. B*, vol. 8, No. 2, (Mar./Apr. 1990) pp. 227-231.

(56) References Cited

OTHER PUBLICATIONS

Xu et al, "Spin-filter devices based on resonant tunneling antisymmetrical magnetic semiconductor hybrid structures," 84 *Appl. Phys. Letters* 11, pp. 1955-1957 (2004).
Yamaguchi et al, "Analysis for Dislocation Density Reduction in Selective Area Growth GaAs Films on Si Substrates," *Appl. Phys. Lett.* vol. 56, No. 1, (Jan. 1, 1990) pp. 27-29.
Yamaguchi et al, "Defect Reduction Effects in GaAs on Si Substrates by Thermal Annealing," *Appl. Phys. Letters* 53 (23), pp. 2293 (1998).
Yamaguchi et al, "GaAs Solar Cells Grown on Si Substrates for Space Use," *Prog. Photovolt.: Res. Appl.* 2001; 9:191-201.
Yamaguchi et al, "Super-high-efficiency Multi-junction Solar Cells," *Prog. Photovolt.: Res. Appl.* 2005; 13:125-32.
Yamamoto et al, "Optimization of InP/Si Heteroepitaxial Growth Conditions Using Organometallic Vapor Phase Epitaxy," *J. Crystal Growth*, vol. 96, (1989) pp. 369-377.
Yang et al, "High Performance CMOS Fabricated on Hybrid Substrate with Different Crystal Orientations," 2003 *IEDM Tech. Dig.*, pp. 453-456.
Yang et al, "Selective Area Deposited Blue GaN-InGaN Multiple-quantum Well Light Emitting Diodes over Silicon Substrates," *Appl. Phys. Letter*, vol. 76, No. 3, (Jan. 17, 2000) pp. 273-275.
Yin et al, "Ultrathin Strained-SOI by Stress Balance on Compliant Substrates and FET Performance," 52 *IEEE Trans. on Electron Devices* 10, pp. 2207-2214 (2005).
Yoon et al, "Selective Growth of Ge Islands on Nanometer-scale Patterned $SiO_2$/Si Substrate by Molecular Beam Epitaxy," *Appl. Phys. Letters*, vol. 89 (2006) pp. 063107-1-063107-3.
Zamir et al, "Thermal Microcrack Distribution Control in GaN Layers on Si Substrates by Lateral Confined Epitaxy," *Appl. Phys. Letters*, vol. 78, No. 3, (Jan. 15, 2001) pp. 288-290.
Zang, K.Y. et al, "Nanoheteroepitaxial lateral overgrowth of GaN on nanoporous Si(111)," *Appl. Phys. Letters*, v 88, n. 14, Apr. 3, 2006, p. 141925.
Zang, K.Y. et al, "Nanoscale lateral epitaxial overgrowth of GaN on Si (111)," *Appl. Phys. Letters*, v 87, n. 19, Nov. 7, 2005, p. 193106-1-193106-3.
Zela et al, "Single-crystalline Ge Grown Epitaxially on Oxidized and Reduced Ge/Si (100) Islands," *J. Crystal Growth*, vol. 263 (2004) pp. 90-93.
Zhang et al, "Removal of Threading Dislocations from Patterned Heteroepitaxial Semiconductors by Glide to Sidewalls," *J. Electronic Materials*, vol. 27, No. 11, (1998) pp. 1248-1253.
Zhang et al, Strain Status of Self-assembled InAs Quantum Dots, *Appl. Phys. Letters*, vol. 77, No. 9, (Aug. 28, 2000) pp. 1295-1297.
Zheleva, T.S. et al, "Lateral epitaxy and dislocation density reduction in selectively grown GaN structures," *J. Crystal Growth*, v. 222, n. 4, Feb. 2001, p. 706-18.
Zubia et al, "Initial Nanoheteroepitaxial Growth of GaAs on Si (100) by OMPVE." *J. Electronic Materials*, vol. 30, No. 7, (2001) pp. 812-816.
"Communication pursuant to Article 94(3) EPC," Application No. 06 770 525.1-2203, Applicant: Taiwan Semiconductor Company, Ltd., Feb. 17, 2011, 4 pages.

\* cited by examiner

LATTICE-MISMATCHED SEMICONDUCTOR STRUCTURES WITH REDUCED DISLOCATION DEFECT DENSITIES AND RELATED METHODS FOR DEVICE FABRICATION

CROSS-REFERENCE TO RELATED APPLICATIONS

This application claims priority to and the benefit of U.S. patent application Ser. No. 11/436,198, filed May 17, 2006, which claims priority to and benefit of U.S. Provisional Application Ser. No. 60/681,940 filed May 17, 2005. The entire disclosures of these applications are incorporated herein by reference.

FIELD OF THE INVENTION

This invention relates generally to lattice-mismatched semiconductor heterostructures and, more specifically, to the reduction of dislocation defects by the formation of a V-groove in a semiconductor substrate.

BACKGROUND OF THE INVENTION

The increasing operating speeds and computing power of microelectronic devices have recently given rise to the need for an increase in the complexity and functionality of the semiconductor structures from which that these devices are fabricated. Hetero-integration of dissimilar semiconductor materials, for example, III-V materials, such as gallium arsenide, gallium nitride, indium aluminum arsenide, and/or germanium with silicon or silicon-germanium substrate, is an attractive path to increasing the functionality and performance of the CMOS platform. In particular, heteroepitaxial growth can be used to fabricate many modern semiconductor devices where lattice-matched substrates are not commercially available or to potentially achieve monolithic integration with silicon microelectronics. Performance and, ultimately, the utility of devices fabricated using a combination of dissimilar semiconductor materials, however, depends on the quality of the resulting structure. Specifically, a low level of dislocation defects is important in a wide variety of semiconductor devices and processes, because dislocation defects partition an otherwise monolithic crystal structure and introduce unwanted and abrupt changes in electrical and optical properties, which, in turn, results in poor material quality and limited performance. In addition, the threading dislocation segments can degrade physical properties of the device material and can lead to premature device failure.

As mentioned above, dislocation defects typically arise in efforts to epitaxially grow one kind of crystalline material on a substrate of a different kind of material—often referred to as "heterostructure"—due to different crystalline lattice sizes of the two materials. This lattice mismatch between the starting substrate and subsequent layer(s) creates stress during material deposition that generates dislocation defects in the semiconductor structure.

Misfit dislocations form at the mismatched interface to relieve the misfit strain. Many misfit dislocations have vertical components, termed "threading segments," which terminate at the surface. These threading segments continue through all semiconductor layers subsequently added to the heterostructure. In addition, dislocation defects can arise in the epitaxial growth of the same material as the underlying substrate where the substrate itself contains dislocations. Some of the dislocations replicate as threading dislocations in the epitaxially grown material. Other kinds of dislocation defects include stacking faults, twin boundaries, and anti-phase boundaries. Such dislocations in the active regions of semiconductor devices, such as diodes, lasers and transistors, may significantly degrade performance.

To minimize formation of dislocations and associated performance issues, many semiconductor heterostructure devices known in the art have been limited to semiconductor layers that have very closely—e.g. within 0.1%—lattice-matched crystal structures. In such devices a thin layer is epitaxially grown on a mildly lattice-mismatched substrate. As long as the thickness of the epitaxial layer is kept below a critical thickness for defect formation, the substrate acts as a template for growth of the epitaxial layer, which elastically conforms to the substrate template. While lattice matching and near matching eliminate dislocations in a number of structures, there are relatively few lattice-matched systems with large energy band offsets, limiting the design options for new devices.

Accordingly, there is considerable interest in heterostructure devices involving greater epitaxial layer thickness and greater lattice misfit than known approaches would allow. For example, it has long been recognized that gallium arsenide grown on silicon substrates would permit a variety of new optoelectronic devices marrying the electronic processing technology of silicon VLSI circuits with the optical component technology available in gallium arsenide. See, for example, Choi et al, "Monolithic Integration of Si MOSFET's and GaAs MESFET's", IEEE Electron Device Letters, Vol. EDL-7, No. 4, April 1986. Highly advantageous results of such a combination include high-speed gallium arsenide circuits combined with complex silicon VLSI circuits, and gallium arsenide optoelectronic interface units to replace wire interconnects between silicon VLSI circuits. Progress has been made in integrating gallium arsenide and silicon devices. See, for example, Choi et al, "Monolithic Integration of GaAs/AlGaAs Double-Heterostructure LED's and Si MOSFET's" IEEE Electron Device Letters, Vol. EDL-7, No. 9, September 1986; Shichijo et al, "Co-Integration of GaAs MESFET and Si CMOS Circuits", IEEE Electron Device Letters, Vol. 9, No. 9, September 1988. However, despite the widely recognized potential advantages of such combined structures and substantial efforts to develop them, their practical utility has been limited by high defect densities in gallium arsenide layers grown on silicon substrates. See, for example, Choi et al, "Monolithic Integration of GaAs/AlGaAs LED and Si Driver Circuit", IEEE Electron Device Letters, Vol. 9, No. 10, October 1988 (p. 513). Thus, while basic techniques are known for integrating gallium arsenide and silicon devices, there exists a need for producing gallium arsenide layers having a low density of dislocation defects.

To control dislocation densities in highly-mismatched deposited layers, there are three known techniques: wafer bonding of dissimilar materials, substrate patterning, and composition grading. Bonding of two different semiconductors may yield satisfactory material quality. Due to the limited availability and high cost of large size Ge or III-V wafers, however, the approach may not be practical.

Techniques involving substrate patterning exploit the fact that the threading dislocations are constrained by geometry, i.e. that a dislocation cannot end in a crystal. If the free edge is brought closer to another free edge by patterning the substrate into smaller growth areas, then it is possible to reduce threading dislocation densities. In the past, a combination of substrate patterning and epitaxial lateral overgrowth ("ELO") techniques was demonstrated to greatly reduce defect densities in gallium nitride device, leading to fabrication of laser diodes with extended lifetimes. This process substantially eliminates defects in ELO regions but highly defective seed windows remain, necessitating repetition of the lithography and epitaxial steps to eliminate all defects. In a similar approach, pendeo-epitaxy eliminates substantially all defects in the epitaxial region proximate to the substrate but requires one lithography and two epitaxial growth steps. Furthermore, both techniques require the increased lateral growth rate of gallium nitride, which has not been demonstrated in all heteroepitaxial systems. Thus, a general defect-reduction process utilizing a minimum of lithography/epitaxy steps that does not rely on increased lateral growth rates would be advantageous both to reduce process complexity and facilitate applicability to various materials systems.

Another known technique termed "epitaxial necking" was demonstrated in connection with fabricating a Ge-on-Si heterostructure by Langdo et al. in "High Quality Ge on Si by Epitaxial Necking," Applied Physics Letters, Vol. 76, No. 25, April 2000. This approach offers process simplicity by utilizing a combination of selective epitaxial growth and defect crystallography to force defects to the sidewall of the opening in the patterning mask, without relying on increased lateral growth rates. Specifically, as shown in FIGS. 1A and 1B, in the (111)<110> diamond cubic slip system, misfit dislocations lie along <110> directions in the (100) growth plane while the threading segments rise up on (111) planes in <110> directions. Threading segments in <110> directions on the (111) plane propagate at a 45° angle to the underlying Si (100) substrate surface. Thus, if the aspect ratio of the holes in the patterning mask is greater than 1, threading segments will be blocked by the mask sidewall, resulting in low-defect top Ge "nodules" formed directly on Si. One important limitation of epitaxial necking, however, is the size of the area to which it applies. In general, as discussed in more detail below, the lateral dimensions (designated as l in FIG. 1A) in both dimensions have to be relatively small in order for the dislocations to terminate at sidewalls.

Thus, there is a need in the art for versatile and efficient methods of fabricating semiconductor heterostructures that would constrain dislocation defects in a variety of lattice-mismatched materials systems. There is also a need in the art for semiconductor devices utilizing a combination of integrated lattice-mismatched materials with reduced levels of dislocation defects for improved functionality and performance.

SUMMARY OF THE INVENTION

Accordingly, embodiments of the present invention provide semiconductor heterostructures with significantly minimized interface defects, and methods for their fabrication, that overcome the limitations of known techniques. In contrast with the prior art approach of minimizing dislocation defects by limiting misfit epitaxial layers to less than their critical thicknesses for elastic conformation to the substrate, in its various embodiments, the present invention utilizes greater thicknesses and limited lateral areas of component semiconductor layers to produce limited-area regions having upper portions substantially exhausted of threading dislocations and other dislocation defects such as stacking faults, twin boundaries, or anti-phase boundaries. As a result, the invention contemplates fabrication of semiconductor devices based on monolithic lattice-mismatched heterostructures long sought in the art but heretofore impractical due to dislocation defects.

In particular applications, the invention features semiconductor structures of Ge or III-V devices integrated with a Si substrate, such as, for example, an optoelectronic device including a gallium arsenide layer disposed over a silicon wafer, as well as features methods of producing semiconductor structures that contemplate integrating Ge or III-V materials on selected areas on a Si substrate.

In general, in a first aspect, a method of forming a structure begins with providing a dielectric sidewall, proximate a substrate, with a height h. The substrate includes a first crystalline semiconductor material and a top surface having a first crystal orientation. The dielectric sidewall defines an opening with a width w exposing a portion of the substrate. A recess, with a maximum depth d and a recessed surface comprising a second crystal orientation, is defined in the exposed portion of the substrate. A second crystalline semiconductor material having a lattice mismatch with the first crystalline semiconductor material is formed in the recess. The lattice mismatch creates defects in the second crystalline semiconductor material, and the defects terminate at a distance H above a deepest point of the recess.

In various embodiments, H may be less than or equal to h+d, d, or w, and the ratio of h+d to w may be greater than or equal to one. The recess may have a V-shaped profile. The first crystal orientation may be (100), and the second crystal orientation may different than (100); for example, the second crystal orientation may be (111).

A third crystalline semiconductor material may be formed above the second crystalline semiconductor material, and may be lattice mismatched to the second crystalline material. The lattice mismatch between the second crystalline semiconductor material and the first crystalline semiconductor material may be less than a lattice mismatch between the third crystalline semiconductor material and the first crystalline semiconductor material. A boundary defined by the interface between the second and third crystalline semiconductor materials may be proximate a boundary defined by the interface between the exposed portion of the substrate and the dielectric sidewall.

The substrate may be removed to expose a bottom portion of the second crystalline semiconductor material. The exposed bottom portion of the second crystalline semiconductor material may include a non-planar surface. After removing the substrate, at least part of the bottom portion of the second crystalline semiconductor material may be removed. Removing at least part of the bottom portion of the second crystalline semiconductor material may include removing a majority of the defects.

A photonic structure may be formed disposed at least partially above the second crystalline semiconductor material or disposed at least partially inside the opening. Examples of photonic structures may include an LED, a PV cell, and/or a laser diode.

In general, in a second aspect, a semiconductor structure includes a substrate including a first crystalline semiconductor material. The substrate has a top surface with a first crystal orientation, and defines a recess with a maximum depth d. The recess includes a recessed surface with a second crystal orientation, and a dielectric sidewall of height h is disposed proximate the recess. A second crystalline semiconductor material of maximum width w is disposed in the recess, and the recess defines an interface between the second crystalline semiconductor material and the substrate. The second crystalline semiconductor material has a lattice mismatch with the first crystalline semiconductor material, the lattice mismatch creates defects in the second crystalline semiconductor material, and the defects terminate at a distance H above a bottom surface of the recess.

In various embodiments H may be less than or equal to h+d, d, or w, and the ratio of h+d to w may be greater than or equal to one. The recess may have a v-shaped profile. The first crystal orientation may be (100), and the second crystal orientation may not be (100); for example, the second crystal orientation may be (111).

A third crystalline semiconductor material may be formed above the second crystalline semiconductor material, and may be lattice mismatched to the second crystalline material. The lattice mismatch between the second crystalline semiconductor material and the first crystalline semiconductor material may be less than a lattice mismatch between the third crystalline semiconductor material and the first crystalline semiconductor material. A boundary defined by the interface between the second and third crystalline semiconductor materials may be proximate a boundary defined by the interface between the exposed portion of the substrate and the dielectric sidewall.

A photonic structure may be formed disposed at least partially above the second crystalline semiconductor material or disposed at least partially inside the opening. Examples of photonic structures may include an LED, a PV cell, and/or a laser diode.

A third crystalline semiconductor material disposed over the second crystalline semiconductor material, and a bandgap of the third crystalline semiconductor material may be lower than a bandgap of the second crystalline semiconductor material. In addition, the second crystalline semiconductor material may be n-doped and the third crystalline semiconductor material may be p-doped. The second crystalline semiconductor material may be GaAs and the third crystalline semiconductor material may be InP.

In general, in a third aspect, a semiconductor structure includes a photonic structure and a crystalline semiconductor disposed above the photonic structure. A surface of the crystalline semiconductor includes a plurality of ridges. A width of one ridge in the plurality of ridges is less than or equal to a visible light wavelength, and a spacing of the plurality of ridges is less than or equal to the visible light wavelength.

In various embodiments, the photonic structure may be an LED, a PV cell, and/or a laser diode. A metal contact may be disposed above the crystalline semiconductor, and the metal contact may conform to at least one ridge.

In general, in a fourth aspect, a method of forming a structure begins with defining a recess with a maximum depth d in a top surface of a (100) substrate. The substrate includes a first crystalline semiconductor material and the recess exposes a (111) surface of the substrate. A III-nitride material having a lattice mismatch with the first crystalline semiconductor material is formed in the recess. The lattice mismatch creates defects in the III-nitride material perpendicular to the (111) surface, resulting in a substantially defect-free region in the III-nitride material.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

In accordance with its various embodiments, the present invention contemplates fabrication of monolithic lattice-mismatched semiconductor heterostructures with limited area regions having upper surfaces substantially exhausted of threading dislocations and other dislocation defects, as well as fabrication of semiconductor devices based on such lattice-mismatched heterostructures.

Silicon (Si) is recognized as presently being the most ubiquitous semiconductor for the electronics industry. Most of silicon that is used to form silicon wafers is formed from single crystal silicon. The silicon wafers serve as the substrate on which CMOS devices are formed. The silicon wafers are also referred to as a semiconductor substrate or a semiconductor wafer. While described in connection with silicon substrates, however, the use of substrates that include, or consist essentially of, other semiconductor materials, is contemplated without departing from the spirit and scope of the present invention.

Figure 1A:
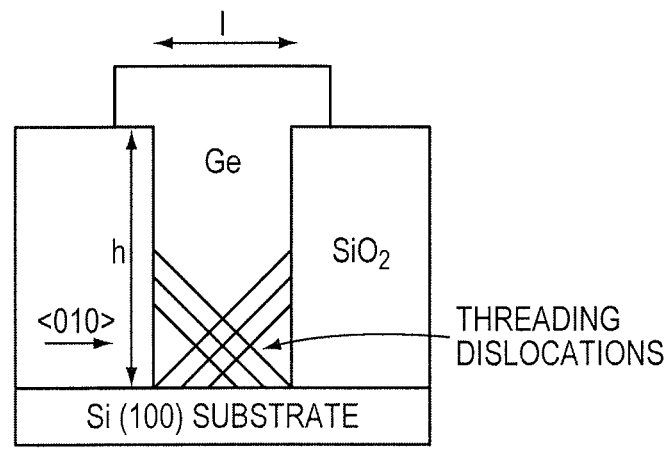
FIG. 1A depicts a schematic cross-sectional side view of a silicon substrate with a germanium layer formed thereon according to an "epitaxial necking" technique known in the art.
Figure 1B:
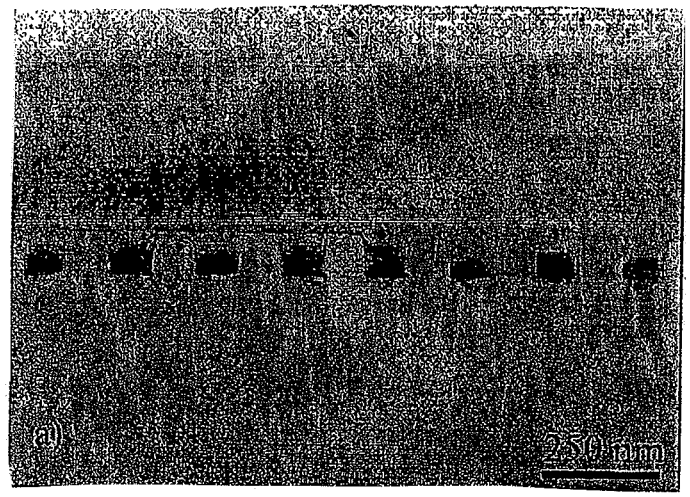
FIG. 1B is an XTEM image illustrating the semiconductor heterostructure of FIG. 1A.
Figure 2:
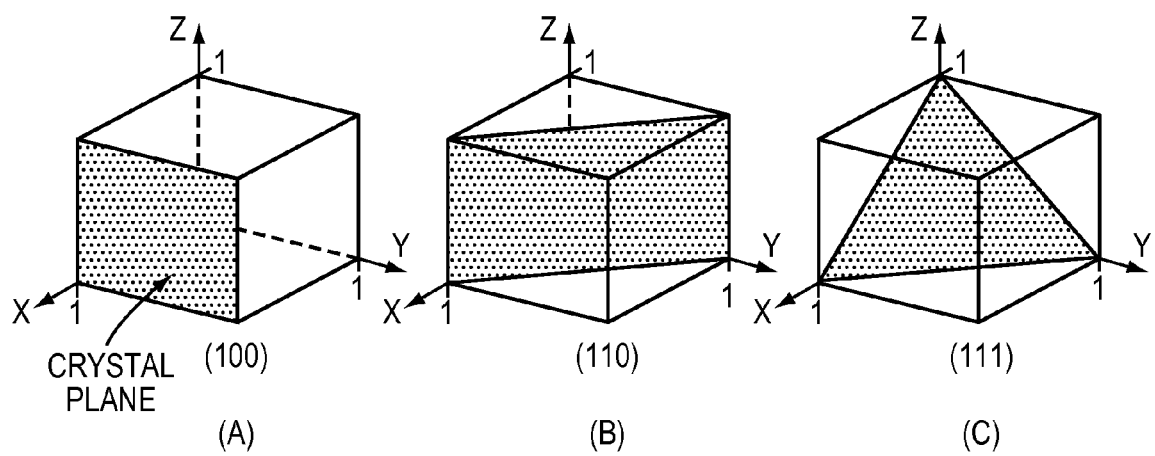
FIGS. 2A-2C are schematic diagrams showing the three types of crystalline orientation for silicon.

In crystalline silicon, the atoms which make up the solid are arranged in a periodic fashion. If the periodic arrangement exists throughout the entire solid, the substance is defined as being formed of a single crystal. If the solid is composed of a myriad of single crystal regions the solid is referred to as polycrystalline material. As readily understood by skilled artisans, periodic arrangement of atoms in a crystal is called the lattice. The crystal lattice also contains a volume which is representative of the entire lattice and is referred to as a unit cell that is regularly repeated throughout the crystal. For example, silicon has a diamond cubic lattice structure, which can be represented as two interpenetrating face-centered cubic lattices. Thus, the simplicity of analyzing and visualizing cubic lattices can be extended to characterization of silicon crystals. In the description herein, references to various planes in silicon crystals will be made, especially to the (100), (110), and (111) planes. These planes define the orientation of the plane of silicon atoms relative to the principle crystalline axes. The numbers {xyz} are referred to as Miller indices and are determined from the reciprocals of the points at which the crystal plane of silicon intersects the principle crystalline axes. Thus, FIGS. 2A-2C show three orientations of the crystal plane of silicon. In FIG. 2A, the crystal plane of silicon intersects the x-axis at 1 and never intersects the y or z-axis. Therefore, the orientation of this type of crystalline silicon is (100). Similarly, FIG. 2B shows (110) crystalline silicon and FIG. 2C shows (111) silicon. The (111) and (100) orientations are the two primary wafer orientations in commercial use. Notably, for any given plane in a cubic crystal there are five other equivalent planes. Thus, the six sides of the cube comprising the basic unit cell of the crystal are all considered (100) planes. The notation {xyz} refers to all six of the equivalent (xyz) planes. Throughout the description, reference will also be made to the crystal directions, especially the <100>, <110> and <111> directions. These are defined as the normal direction to the respective plane. Thus, the <100> direction is the direction normal to the (100) plane. The notation <xyz> refers to all six equivalent directions.

As discussed above, there is a need in the art for versatile and efficient methods of fabricating semiconductor heterostructures that would constrain substrate interface defects in a variety of lattice-mismatched materials systems. One conventional technique mentioned above that addresses control of threading dislocation densities in highly-mismatched deposited layers, termed "epitaxial necking," is applicable only to devices with relatively small lateral dimensions. Specifically, in the prior art, metal oxide semiconductor ("MOS") transistors are typically fabricated on (100) silicon wafers with the gates oriented such that current flows parallel to the <110> directions. Thus, for a FET device built on a (100) Si wafer with device channel orientation aligning with the <110> direction, both the channel width and channel length should be small compared to the height of a epitaxial necking mask, in order for the dislocations in a lattice-mismatched semiconductor layer to terminate at a sidewall of the mask on both directions. However, in modern CMOS circuits, the MOSFET device width often substantially exceeds the channel length, which, as a result of CMOS scaling, is frequently very small. Accordingly, under the conventional necking approach, a number of dislocations will not be terminated at the sidewall of the mask in the direction of the channel width.

Figure 3A:
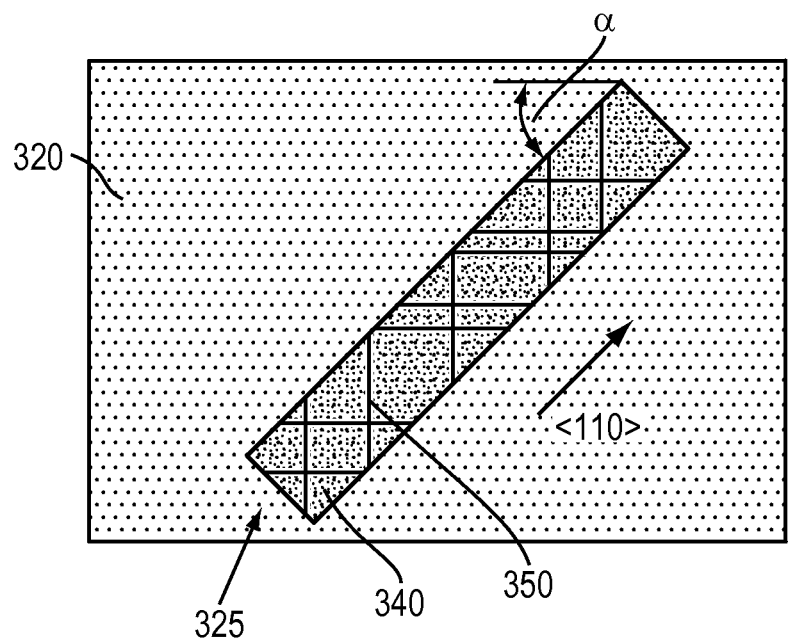
FIGS. 3A-3B, 4A-4E, and 5A-5B depict schematic views of different lattice-mismatched semiconductor heterostructures and structures for blocking dislocations therein, according to various embodiments of the invention.
Figure 3B:
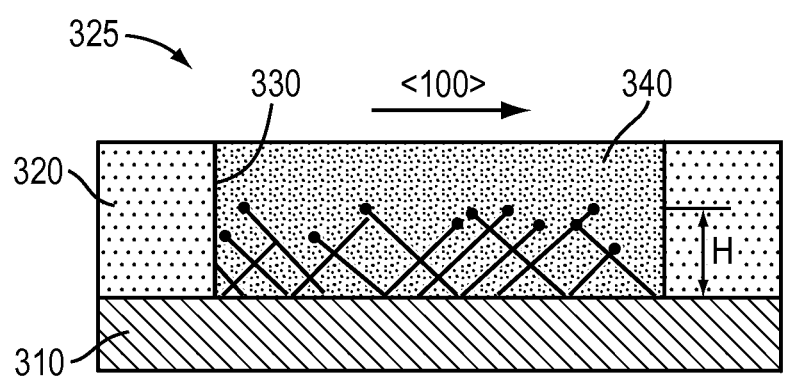

In contrast with the prior art approach of minimizing dislocation defects, in its various embodiments, the present invention addresses the limitations of known techniques, by utilizing greater thicknesses and limited lateral areas of component semiconductor layers to produce limited-area regions having upper portions substantially exhausted of dislocation defects. Referring to FIGS. 3A-3B, a substrate 310 is provided that includes, or consists essentially of, a first semiconductor material, such as, for example, a group IV element, e.g., germanium or silicon. The first semiconductor material may be crystalline. The substrate 310 may be, for example, a bulk silicon wafer, a bulk germanium wafer, a semiconductor-on-insulator (SOI) substrate, or a strained semiconductor-on-insulator (SSOI) substrate. In one embodiment, the substrate 310 includes or consists essentially of (100) silicon. The substrate 310 may include a material having a first conductivity type, e.g., n- or p-type, such as n$^+$ Si.

A dislocation-blocking mask 320 is disposed over the substrate. The mask has an opening 325 extending to the surface of the substrate and defined by at least one sidewall 330. In various embodiments, the opening 325 is generally rectangular. The dislocation-blocking mask may include a dielectric material, such as, for example, silicon dioxide or silicon nitride. At least a portion of the sidewall meets the surface of the substrate at an orientation angle α to a selected crystallographic direction of the first semiconductor material. In addition, at least a portion of the sidewall is generally vertical, i.e. disposed at about 80 to 120 degrees to the surface of the substrate, and, in a particular embodiment, substantially perpendicular to the surface of the substrate.

A regrowth layer 340 that includes a second semiconductor material is deposited in the opening. In one embodiment, the selected crystallographic direction of the first semiconductor material is aligned with direction of propagation of threading dislocations in the regrowth layer. In certain embodiments, the orientation angle ranges from about 30 to about 60 degrees, for example, is about 45 degrees to such crystallographic direction. The surface of the substrate may have (100), (110), or (111) crystallographic orientation. In some embodiments, the selected crystallographic direction is substantially aligned with a <110> crystallographic direction of the first semiconductor material.

In various embodiments, the first semiconductor material may include, or consist essentially of, silicon or a silicon germanium alloy. The second semiconductor material may include, or consist essentially of, a group II, a group III, a group IV, a group V, and/or a group VI element, and/or combinations thereof, for example, selected from the group consisting of germanium, silicon germanium, gallium arsenide, aluminum antimonide, indium aluminum antimonide, indium antimonide, indium arsenide, indium phosphide, and gallium nitride.

The regrowth layer can be formed in the opening by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), or by atomic layer deposition (ALD). In the CVD process, selective epitaxial growth typically includes introducing a source gas into the chamber. The source gas may include at least one precursor gas and a carrier gas, such as, for example hydrogen. The reactor chamber is heated, such as, for example, by RF-heating. The growth temperature in the chamber ranges from about 300° C. to about 900° C. depending on the composition of the regrowth layer. The growth system also may utilize low-energy plasma to enhance the layer growth kinetics.

The epitaxial growth system may be a single-wafer or multiple-wafer batch reactor. Suitable CVD systems commonly used for volume epitaxy in manufacturing applications include, for example, EPI CENTURA single-wafer multi-chamber systems available from Applied Materials of Santa Clara, Calif., or EPSILON single-wafer epitaxial reactors available from ASM International based in Bilthoven, The Netherlands.

In some embodiments, the regrowth layer is compositionally graded, for example, includes Si and Ge with a grading rate in the range of >5% Ge/μm to 100% Ge/μm, preferably between 5% Ge/μm and 50% Ge/μm, to a final Ge content of between about 10% to about 100% While the overall grading rate of the graded layer is generally defined as the ratio of total change in Ge content to the total thickness of the layer, a "local grading rate" within a portion of the graded layer may be different from the overall grading rate. For example, a graded layer including a 1 μm region graded from 0% Ge to 10% Ge (a local grading rate of 10% Ge/μm) and a 1 μm region graded from 10% Ge to 30% Ge (a local grading rate of 20% Ge/μm) will have an overall grading rate of 15% Ge/μm. Thus, the regrowth layer may not necessarily have a linear profile, but may comprise smaller regions having different local grading rates. In various embodiments, the graded regrowth layer is grown, for example, at 600-1200° C. Higher growth temperatures, for example, exceeding 900° C. may be preferred to enable faster growth rates while minimizing the nucleation of threading dislocations. See, generally, U.S. Pat. No. 5,221,413, incorporated herein by reference in its entirety.

In a particular embodiment, the first semiconductor material is silicon and the second semiconductor material is germanium. In this embodiment, threading dislocations 350 in the regrowth layer propagate along a <110> direction, and lie at an angle of 45-degrees to the surface of the first semiconductor material. The dislocation mask having a generally rectangular opening is disposed over the substrate such that the sidewall of the opening is disposed at a 45-degree angle to a <100> direction and is substantially aligned with a <110> crystallographic direction. As a result of such orientation of the opening, dislocations will reach and terminate at the sidewalls of the opening in the dislocation-blocking mask at or below a predetermined distance H from the surface of the substrate, such that threading dislocations in the regrowth layer decrease in density with increasing distance from the surface of the substrate. Accordingly, the upper portion of the regrowth layer is substantially exhausted of threading dislocations, enabling formation of semiconductor devices having increased channel width.

In certain versions of this and other embodiments of the invention, the sidewall of the opening in the dislocation-blocking mask has a height at least equal to a predetermined distance H from the surface of the substrate. In these embodiments, the opening is substantially rectangular and has a predetermined width W that is smaller than a length L of the opening. For example, the width W of the opening can be less than about 500 nm, and the length L of the opening can exceed each of W and H. In some versions of these embodiments, the substrate consists essentially of silicon and has a (100) crystallographic orientation, the orientation angle is about 45 degrees to propagation of dislocations in the regrowth layer, and the predetermined distance H is at least $W\sqrt{2}$. In other versions, the substrate consists essentially of silicon and has a (110) crystallographic orientation, the orientation angle is about 45 degrees, and the predetermined distance H is at least $W\sqrt{6/3}$. In still other versions, the substrate consists essentially of silicon and has a (111) crystallographic orientation, the orientation angle is about 45 degrees, and the predetermined distance H is at least 2 W.

In various embodiments of the invention, blocking of the dislocations is promoted both by geometry and orientation of the mask discussed above as well as because of the 'image force' whereby dislocations are attracted to substantially vertical surfaces, as explained in more detail below. In many embodiments, the image force alone is sufficient to cause the upper portion of the regrowth layer to be substantially exhausted of threading dislocations and other dislocation defects.

Figure 4A:
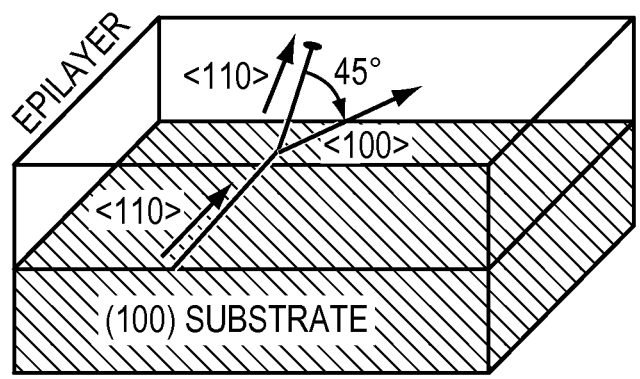
Figure 4B:
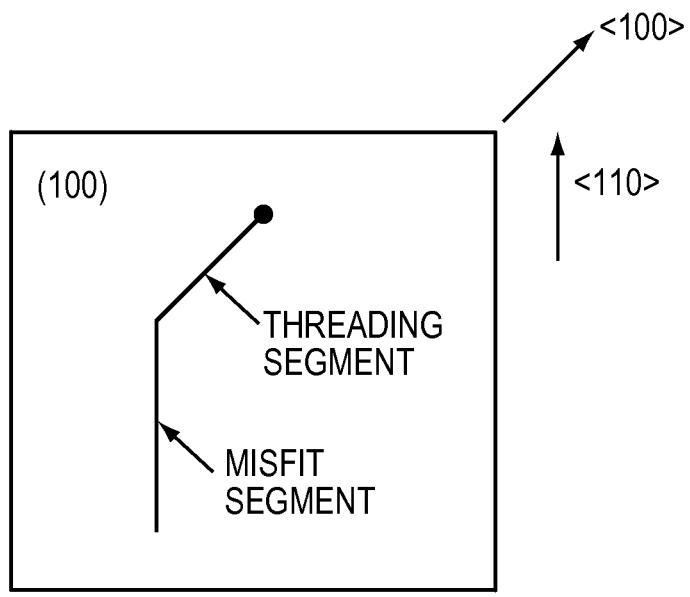

As skilled artisans will readily recognize, a dislocation near a surface experiences forces generally not encountered in the bulk of a crystal, and, in particular, is attracted towards a free surface because the material is effectively more compliant there and the dislocation energy is lower. See Hull & Bacon, *Introduction to Dislocations*, 4$^{th}$ edition, Steel Times (2001). Image force is determined by material properties of the semiconductor being grown, as well as the distance between a given dislocation and the free surface. Thus, even when the dislocations have an orientation that does not favor trapping at sidewalls, the approach discussed above is still effective at certain dimensions because of the boundary forces that draw dislocations to free surfaces in order to reduce the elastic energy of the crystal. Mathematically, these forces arise because the boundary conditions of the expressions for strain require strain components normal to a surface to be zero at that surface. Thus, force per unit of dislocation length on an edge dislocation, toward a vertical sidewall can be represented by the formula:

$$F_I = \frac{Gb^2}{4\pi d(1-v)}$$

where
$F_I$=Image force
G=Shear modulus
d=distance from free surface
b=Burgers vector
v=Poisson's ratio Referring to FIGS. 4A-4B, as used herein, the term "60° dislocation" refers to a dislocation for which the angle between the Burgers vector and the dislocation line is 60°. These dislocations typically form in diamond-cubic or zincblende lattice-mismatched systems where the strain is relatively low (e.g. <2%). In the absence of forces on threads (which can come from other dislocations nearby or from a free surface nearby) they rise from the substrate surface at a 45° angle in <110> directions. However, when viewed from above (normal to the surface) they appear to lie in <100> directions.

Experimentally, it has been shown that for the case of germanium on silicon (4% mismatch) dislocations within approximately 300 nm of a $SiO_2$ sidewall are trapped. This is understood to be due to the influence of the image force. The angle between these dislocations and the sidewall appears to range between approximately 45-55°.

The relevant material constants for Ge are:
G=4.1e11 dyne/cm$^2$
v=0.26; and
b=3.99 Å

Based on the above formula and the experimental observation that for d≤300 nm dislocations in Ge on Si are bent toward an $SiO_2$ sidewall, the force necessary to bend a dislocation in a cubic semiconductor crystal toward a free surface is approximately 2.3 dyne/cm. Thus, distance from free surface d for other materials can be estimated with certain degree of accuracy based on their known values for G, v, and b. For example, by these calculations:

| | |
|---|---|
| For GaAs | d = 258 nm |
| For InP | d = 205 nm |
| For AlSb | d = 210 nm |
| For InSb | d = 164 nm |

Figure 4C:
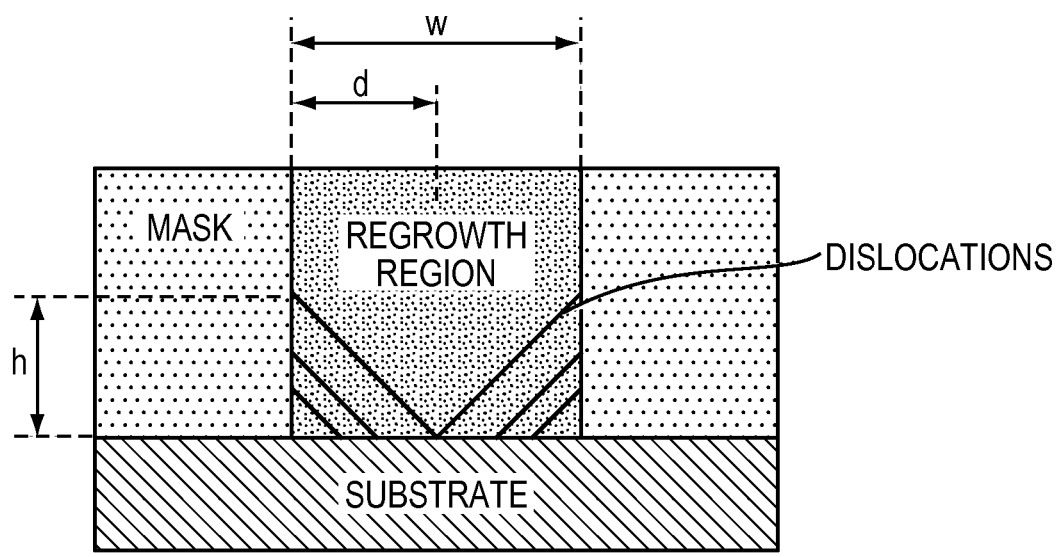

Referring to FIG. 4C, for full trapping, the hole or trench lateral dimension w is preferably less than or equal to approximately 2*d, while the vertical dimension h is preferably at least approximately d, where d is calculated discussed above. These criteria are expected to be substantially independent of the orientation of the boundary of the sidewall and the substrate surface. Thus, in various embodiments of the invention, dislocations in the lower portion of the regrowth layer are trapped by employing a dislocation-blocking mask with an elongated opening, e.g. a trench, having a width calculated as discussed above and oriented without any regard for the direction of propagation of dislocations in the regrowth layer.

Figure 4D:
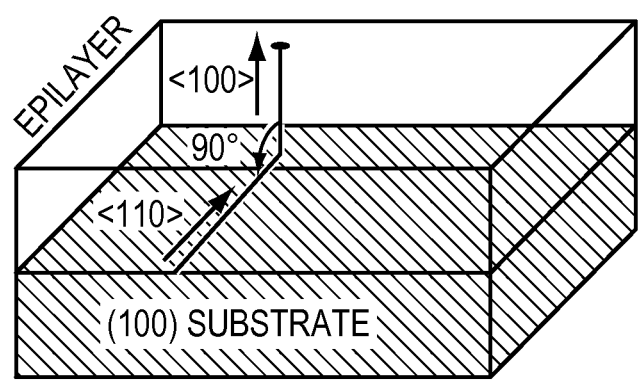

Further, as shown in FIG. 4D and used herein, the term "90° dislocation" refers to a dislocation for which the angle between the Burgers vector and the dislocation line is 90°.

Figure 4E:
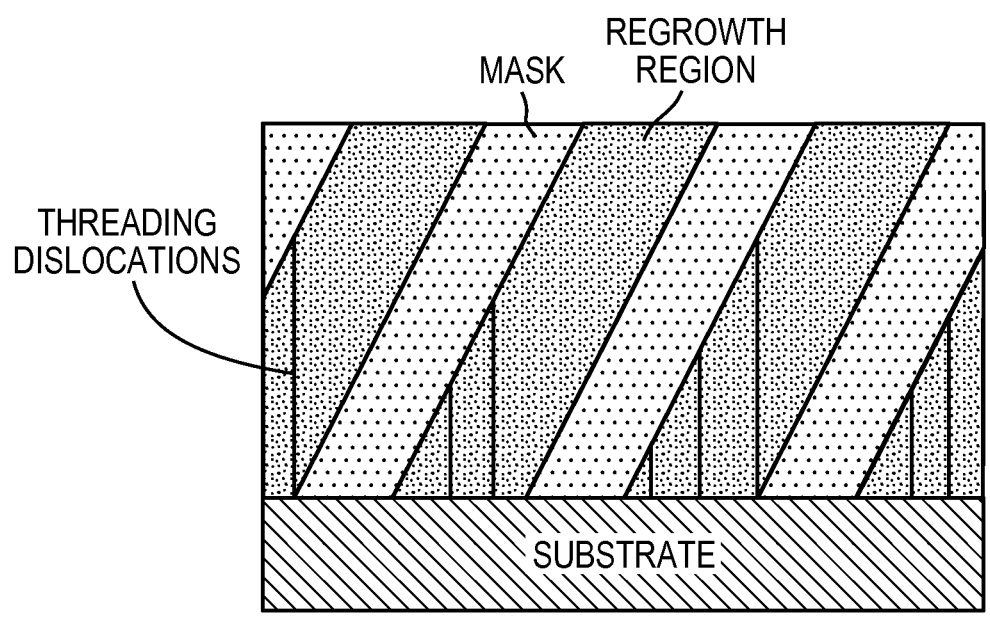

These dislocations primarily form in mismatched systems where the strain is relatively high (e.g. >2%). In the absence of forces on threading dislocation (which can come from other dislocations nearby or from a free surface nearby) they rise from the substrate surface at a 90° angle in <100> directions. Thus, these dislocations can be trapped most optimally by using a dislocation-blocking mask with slanted, rather than vertical sidewalls, as shown in FIG. 4E.

The following summarizes mechanisms for trapping dislocations in different kind of diamond-cubic or zincblende semiconductor heterostructures:
1. Low Mismatch, Low Image Force
   60° dislocations predominate
   Threads lie in <110> directions, rising from surface at 45°
   Best approach for trapping dislocations is to rely on appropriate orientation of sidewalls and appropriate dimensioning of openings, as described above in connection with FIGS. 3A-3B;
2. Low Mismatch, High Image Force
   60° dislocations predominate
   Threads bend toward free substantially vertical surfaces
   Best approach for trapping dislocations is described above in connection with FIGS. 4A-4C;
3. High Mismatch, High Image Force
   90° dislocations predominate
   Threads bend toward free substantially vertical surfaces
   Best approach for trapping dislocations is described above in connection with FIGS. 4A-4C; and
4. High Mismatch, Low Image Force
   90° dislocations predominate
   Threads lie in <100> directions, rising from surface at 90°
   Best approach for trapping dislocations is described above in connection with FIGS. 4D-4E Hexagonal semiconductors, such as the III-nitride (III-N) materials, are of great interest for high-power high-speed electronics and light-emitting applications. For epitaxy of hexagonal semiconductors such as III-nitrides on Si, the (111) surface of Si is commonly preferred over the (100). This is because the (111) surface of Si is hexagonal (even though Si is a cubic crystal). This makes a better template for hexagonal crystal growth than the cubic (100) face. However, as mentioned above, epitaxial necking approach discussed above is less effective in these applications, because the threading dislocations in the hexagonal semiconductors disposed over the lattice-mismatched Si (111) substrates may not be effectively confined by the vertical sidewalls because the threading dislocations in such materials typically have a different orientation relative to the substrate, compared to the more commonly used cubic semiconductors, such as Si, Ge, and GaAs. For example, as described above in connection with FIG. 4E, for certain surface orientations of substrate and crystalline structure of lattice-mismatched regrowth region, the threading defects tend to propagate perpendicular to the substrate, which may not favor trapping by vertical sidewalls of the dislocation-blocking mask. This is the case when GaN is grown on the (100) surface of Si. In such a case, in some embodiments, the angle of the sidewalls of the opening can be slanted relative to the substrate, as shown in FIG. 4E such that vertically propagating defects intersect the angled sidewalls.

Figure 5A:
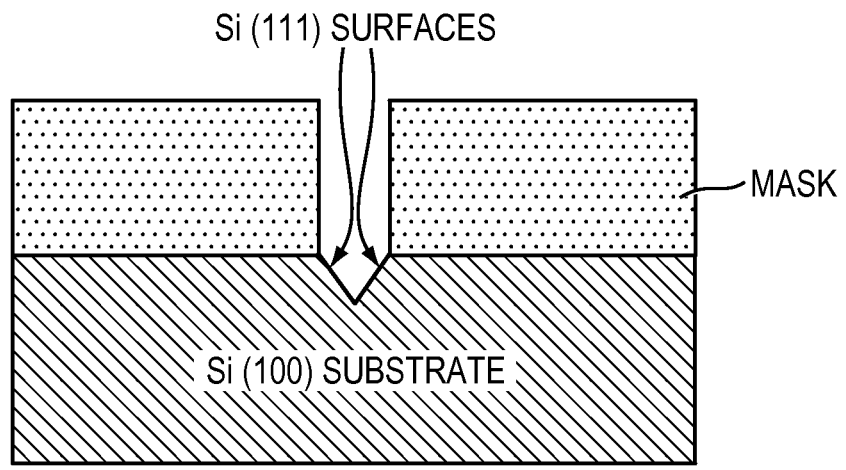
Figure 5B:
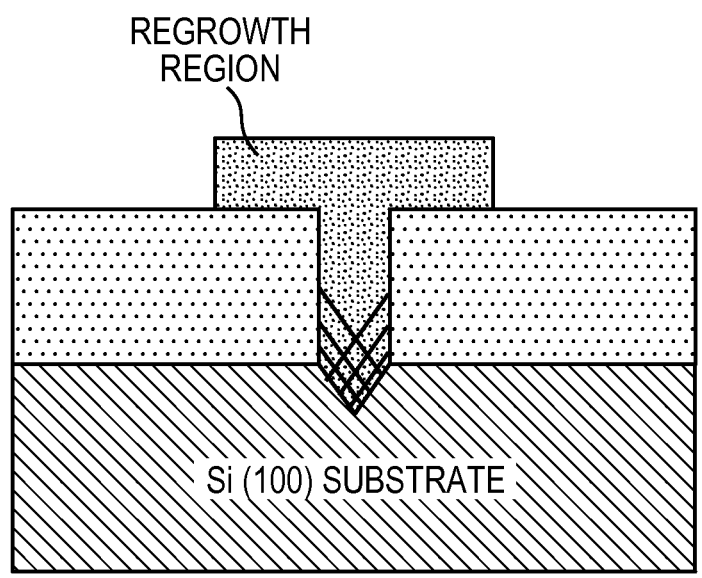

In other embodiments, the surface of the underlying substrate itself exposed in the opening is configured to enable confinement of the threading dislocations. Referring to FIG. 5A, after the dislocation-blocking mask is disposed over the Si (100) substrate and an opening is defined therethrough, an etch that is selective to the (111) crystallographic plane of Si, for example, a KOH solution, is applied to the portion of the substrate exposed at the bottom of the seed window to expose (111) surfaces. A lattice-mismatched semiconductor material is then deposited in the opening over the substrate, and the epitaxial deposition continues such that a heteroepitaxial region is grown over the material disposed in the opening, laterally expanding over the mask. Because of the configuration of the underlying surface, orientation of the threading dislocations in the heteroepitaxial region is at approximately 45° to the surface of the substrate, facilitating trapping of the dislocation by substantially vertical sidewalls of the mask, as shown in FIG. 5B. Then, if small areas of hexagonal semiconductor material are desired for device active areas, the heteroepitaxial overgrowth regions expanding from the individual openings can be planarized (e.g. via CMP), to be substantially co-planar with the adjacent insulator areas. Alternatively, if a large area is desired, growth can proceed until neighboring regions coalesce, followed optionally by planarization of the resulting structure. In the latter case, because lateral growth rates of hexagonal semiconductor can be dramatically increased over growth rate normal to the surface employing various known approaches, these semiconductor materials afford process flexibility not available with cubic semiconductors grown on (100) surfaces. Specifically, differential growth rates of these materials allows for widely-spaced seed trenches; for example, spacing may be five times trench width or even greater, offering a substantial advantage over closely-spaced seed trenches, if the defects which are known to form when epitaxial growth fronts coalesce cannot be substantially eliminated.

FIGS. 6A-6F depicts schematic cross-sectional side views of the lattice-mismatched semiconductor heterostructures having increased surface area according to various embodiments of the invention. Specifically, as discussed in more detail below, the area of the upper portion of the lattice-mismatched heterostructure substantially exhausted of threading dislocations is increased, compared to the embodiments described above with reference to FIGS. 3A-3B. For example, as described in more detail below, in some embodiments, the opening in the dislocation-blocking mask has a variable width. In other versions, the sidewall of the opening in the dislocation-blocking mask includes a first portion disposed proximal to the surface of the substrate, and a second portion disposed above the first portion. A height of the first portion can be at least equal to a predetermined distance H from the surface of the substrate, where the threading dislocations terminate at the sidewall of the opening in the dislocation-blocking mask at or below the distance H. In some versions of these embodiments, the first portion of the sidewall can be substantially parallel to the second portion. Also, in some versions, the second portion of the sidewall is flared outwardly.

In many of the embodiments described below, a substrate 510 includes, or consists essentially of, silicon. The regrowth layer includes, or consists essentially of, a semiconductor material that is one of a group II, a group III, a group IV, a group V, and/or a group VI elements, and/or combinations thereof, for example, selected from the group consisting of germanium, silicon germanium, gallium arsenide, aluminum antimonide, indium aluminum antimonide, indium antimonide, indium arsenide, indium phosphide and gallium nitride. A dislocation-blocking mask 520 having an opening therein is disposed over the substrate. The dislocation-blocking mask may include a dielectric material, such as, for example, silicon dioxide or silicon nitride. At least a portion of the sidewall meets the surface of the substrate at an orientation angle $\alpha$ to a selected crystallographic direction of the first semiconductor material. A regrowth layer 540 that includes a second semiconductor material is deposited in the opening. In various embodiments, the selected crystallographic direction of the first semiconductor material is aligned with direction of propagation of threading dislocations in the regrowth layer. In various embodiments, the orientation angle ranges from about 30 to about 60 degrees, for example, is about 45 degrees. As mentioned above, in many embodiments of the invention, blocking of the dislocations is promoted by geometry and orientation of the mask discussed above and/or the 'image force.'

Figure 6A:
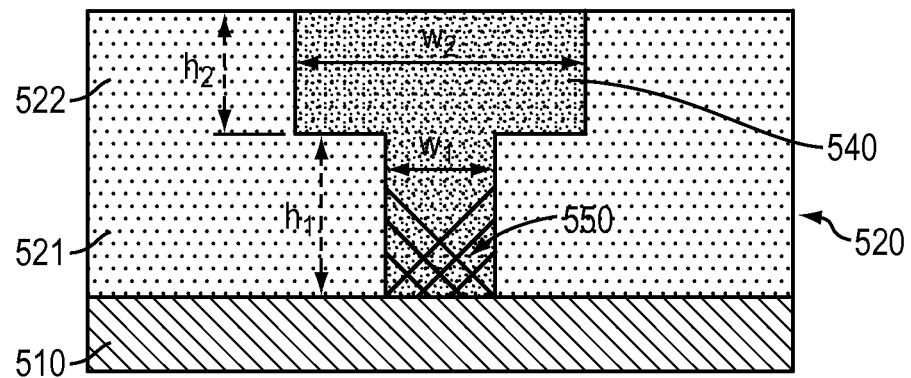
FIGS. 6A-6H and 7A-7C depict schematic cross-sectional side views of the lattice-mismatched semiconductor heterostructures having increased active area, according to various embodiments of the invention.

Referring to FIG. 6A, in one embodiment, the dislocation-blocking mask is formed by depositing a first low-temperature oxide layer 521 having thickness h1 over the substrate. The thickness h1 is selected to be at least equal to the distance from the surface of the substrate at which the threading dislocations (and/or other dislocation defects such as stacking faults, twin boundaries, or anti-phase boundaries) terminate at the sidewall of the opening in the dislocation-blocking mask, as discussed above. A first aperture having a diameter d1 or a first trench having a width w1, both the width w1 and diameter d1 being smaller than the thickness h1, are formed in the layer 521 by a conventional masking/etching technique. After the mask is stripped, a second low-temperature oxide layer 522 having a thickness h2 is deposited over the layer 521. Then, a second aperture of diameter d2 or a second trench having a width w2 is formed in the layer 522 by a conventional masking/etching technique, such that w1<w2 (or d1<d2). After the mask is stripped, the regrowth layer of second semiconductor material is deposited in the first and second apertures or in first and second trenches by selective epitaxy, according to any of the techniques disclosed in U.S. Patent Application Publication No. 2004/0045499A by Langdo et al., incorporated herein by reference. As discussed above, following deposition, threading dislocations and/or other dislocation defects substantially terminate in the first aperture (or in the first trench) at or below thickness h1. As a result, the regrowth layer portion having thickness h2 that is substantially exhausted of threading dislocations is obtained with an upper surface that is larger compared to the embodiments described above with reference to FIGS. 3A-3B.

Figure 6B:
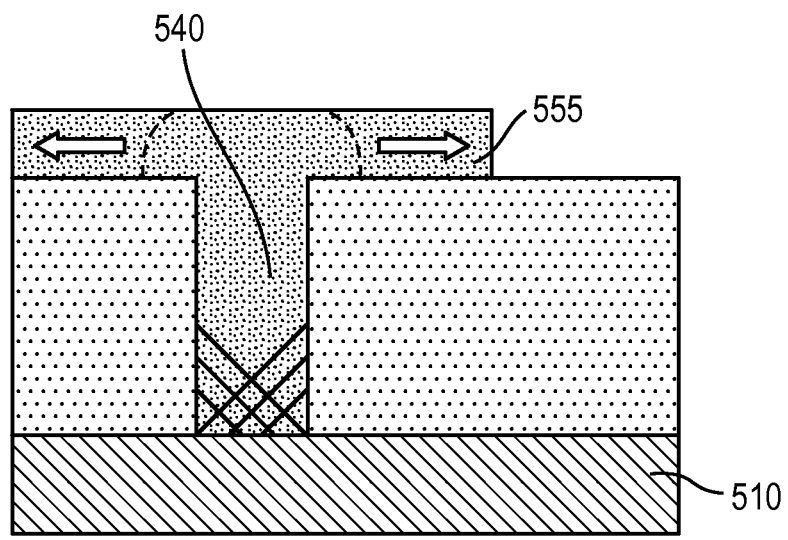

Referring to FIG. 6B, in another embodiment, an overgrowth layer 555 that includes the second semiconductor material is deposited over the regrowth layer 540 and over a portion of the dislocation-blocking mask 520 adjacent to the regrowth layer. At least a portion of the overgrowth layer may be deposited as non-crystalline (i.e. amorphous) material and can be crystallized subsequently, for example by an anneal step at a temperature higher than the deposition temperature. Thus, in this embodiment, crystallization of the overlayer is used to create crystal material in the overlayer regions over the regrowth layer, which is amorphous upon deposition. The arrows in FIG. 6B indicate a crystallized region expanding outward from the opening in the dislocation blocking mask, as amorphous material which may form at least a portion of the overgrowth layer 555 is crystallized.

Figure 6C:
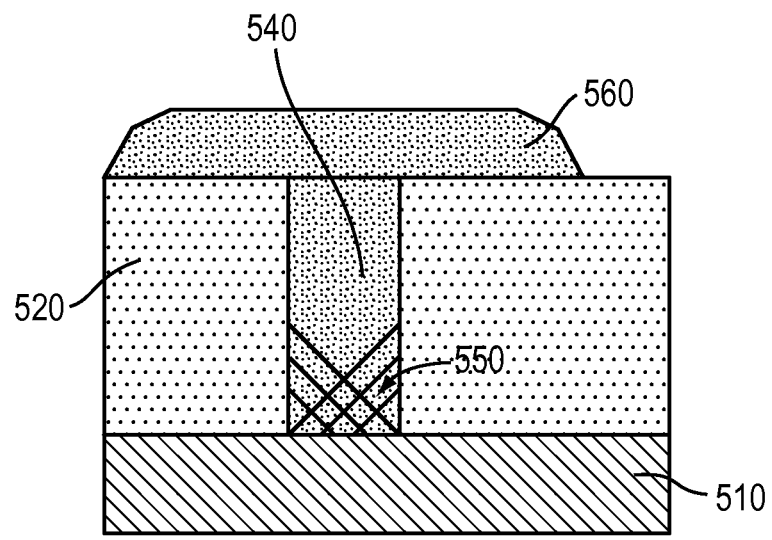

Referring to FIG. 6C, in yet another embodiment, deposition of the regrowth layer in the opening of the dislocation-blocking mask is followed by a step of lateral epitaxial deposition to increase the useful surface area. It may also utilize the higher growth rates typical of (100) surfaces compared to (110) or (111) surface to increase lateral overgrowth in this embodiment. For example, the overgrowth regions can be used as source/drain areas which typically have less stringent material quality requirement than the channel material.

Figure 6D:
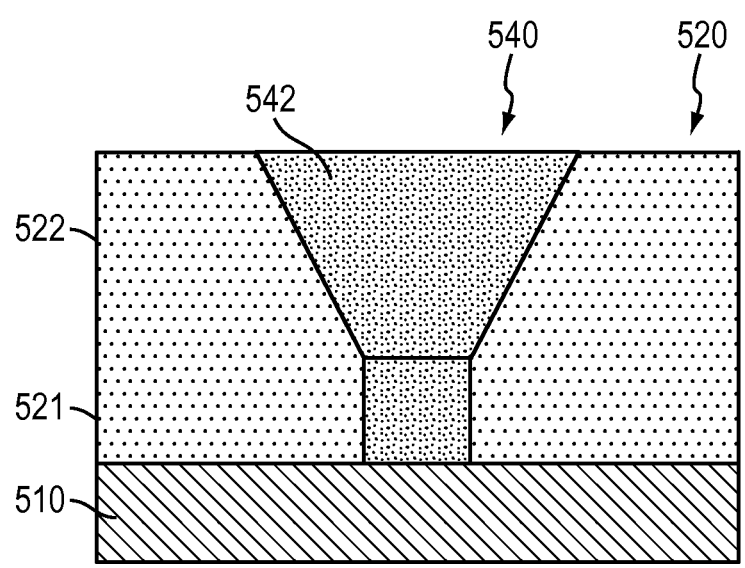

Referring to FIG. 6D, in still another embodiment, the useful upper area of the regrowth layer 540 is increased by gradually increasing the size of the regrowth region. Similar to the embodiment described above with reference to FIG. 6A, the dislocation-blocking mask includes two layers—a first layer having thickness h1, and a second layer having thickness h2. The thickness h1 is selected to be at least equal to the distance from the surface of the substrate at which the threading dislocations and/or other dislocation defects terminate at the sidewall of the opening in the dislocation-blocking mask, as discussed above. That is, a first aperture having a diameter d1 or a first trench having a width w1, both the width w1 and diameter d1 being smaller than the thickness h1, are formed in the layer 521 by a conventional masking/etching technique. After the mask is stripped, a second low temperature oxide layer 522 having a thickness h2 is deposited over the layer 521. Then, a second aperture of diameter d2 or a second trench having a width w2 is formed in the layer 522 by a conventional masking/etching technique, such that w1<w2 (or d1<d2). In contrast to the embodiment depicted in FIG. 6A, however, the width w2 of the second trench is gradually increased such that the sidewall of the trench, i.e. the opening in the layer 522, gradually flares outwardly. This effect can be achieved, for example, by conventional masking/etching techniques wherein the etchant and masking material are chosen such that the masking material is eroded laterally during the etching process, gradually exposing more of the dislocation-blocking mask below, resulting in an opening in the dislocation-blocking mask that flares outward. For example, the masking material could be conventional photoresist and the etchant could be a mixture of the gases $CF_4$ and $H_2$, used in a conventional RIE system. After the mask is stripped, the regrowth layer of second semiconductor material is deposited by selective epitaxy in the opening defined by the layers 521, 522. As discussed above, following deposition, threading dislocations (and/or other dislocation defects such as stacking faults, twin boundaries, or anti-phase boundaries) substantially terminate in the first aperture (or in the first trench) at or below thickness h1. Thus, in this embodiment, the dislocations are terminated in the first portion of the regrowth region at or below thickness h1, and then the regrowth layer becomes larger and larger gradually, allowing for high-quality epitaxial growth with large surface area for large device fabrication.

Figure 6E:
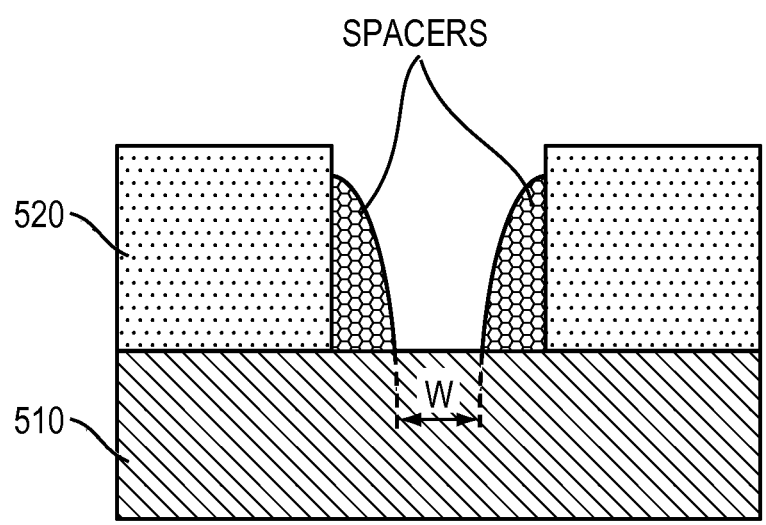

Referring to FIG. 6E, in an alternative version of the embodiment discussed above in connection with FIG. 6D, a dislocation-blocking mask having an opening with outward slanted sidewalls, i.e. the structure that is substantially narrower at the bottom than the top, can be formed with only one lithography step, followed by spacer deposition and etch. This technique is generally more economical and may overcome lithographic alignment problems, or lithographic minimum feature limitations, inherent with the lithography-and-etch approach. The spacers can be formed from the same or different material than the insulator layer. For either case, selective epitaxial growth follows creation of the opening or trench.

Figure 6F:
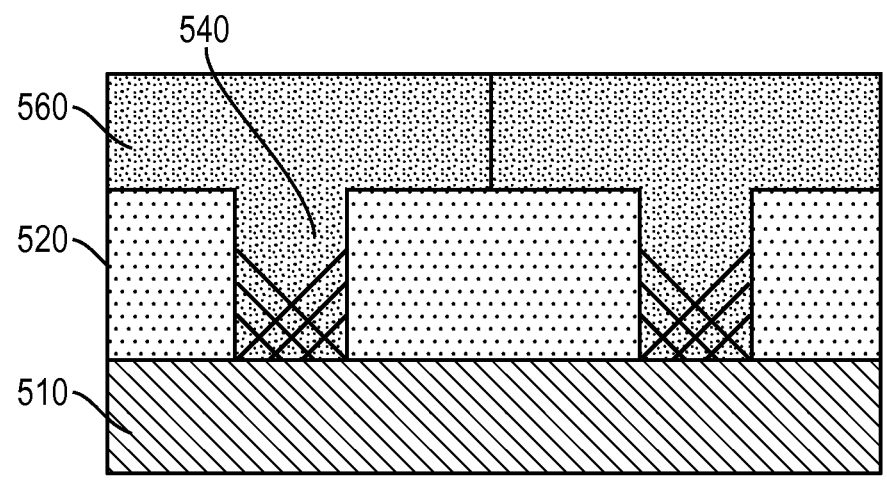
Figure 6G:
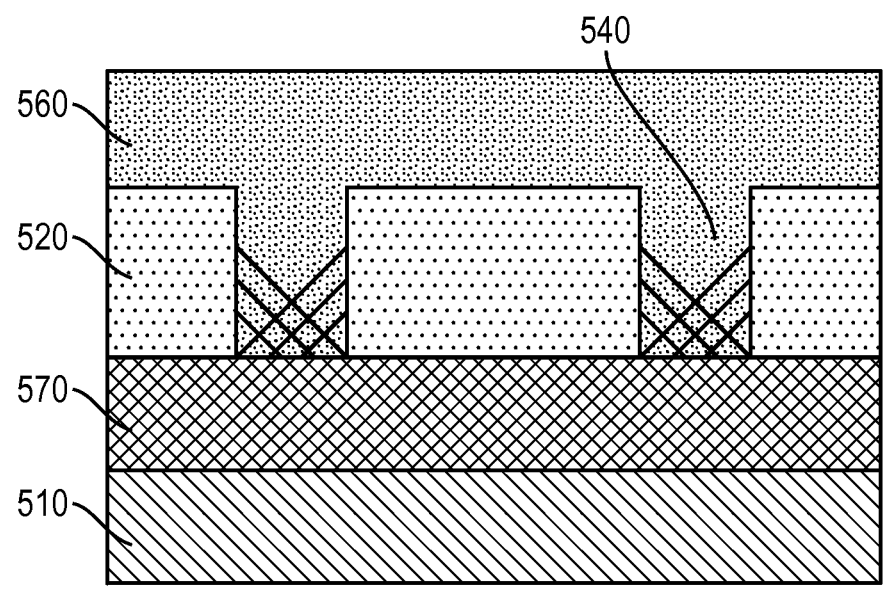
Figure 6H:
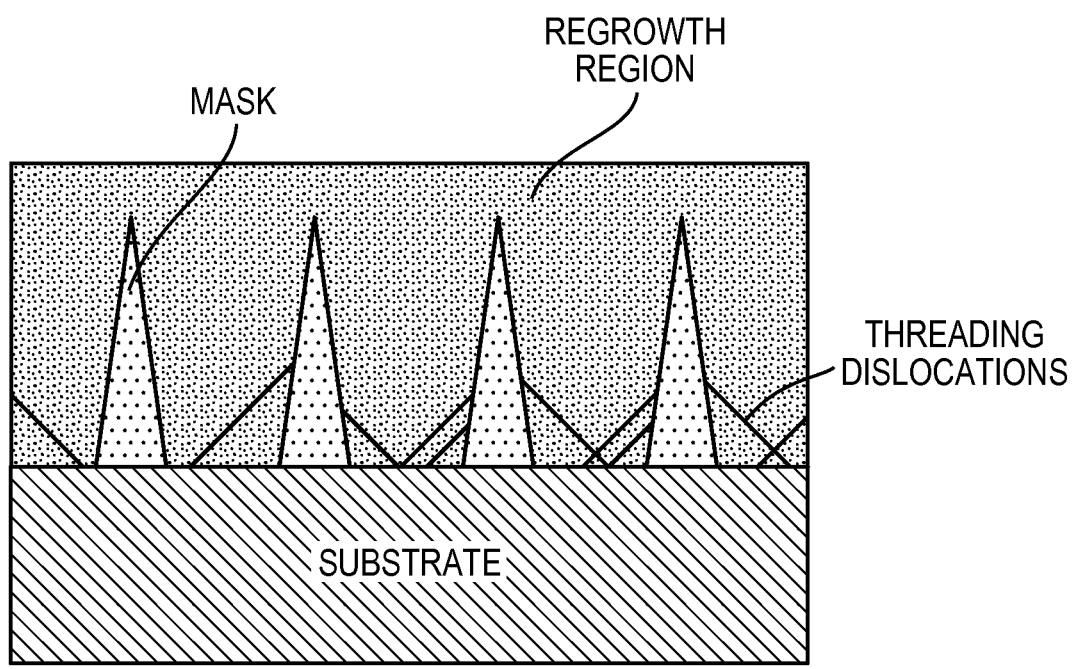

FIGS. 6F-6H show further techniques to increase the surface area. Referring to FIG. 6F (as well as, again, to FIG. 6B), in one embodiment, silicon nitride is utilized instead of silicon dioxide as a dielectric material for the dislocation-blocking mask 520 that defines two openings 535. After the regrowth regions 540 are epitaxially grown in the openings, overgrowth regions 560 are deposited thereover. Using silicon nitride facilitates merging two overgrown regions on the surface of dislocation-blocking mask 520 layer with fewer defects, resulting in larger surface area. Referring to FIG. 6G, in one particular version of the embodiment of FIG. 6F, a layer of second semiconductor material 570 is deposited over the substrate 510 before forming the dislocation-blocking mask 520 thereon, such that the regrowth regions 540 merge at the top of the dislocation-blocking mask with pre-defined lattice spacing. This lattice spacing in the regrowth regions follows the lattice spacing of the layer 570 and thus it has less lattice misalignment when two epitaxy structures merge. Referring to FIG. 6H, in another version of the embodiment of FIG. 6F, the dislocation-blocking mask defines two or more closely spaced flared openings, such that a horizontal top surface of the mask is minimized or, in certain implementations, eliminated. In this version, the lateral overgrowth region, often prone to defects, is negligible or altogether absent, thereby improving the quality of the resulting merged overgrowth region.

Figure 7A:
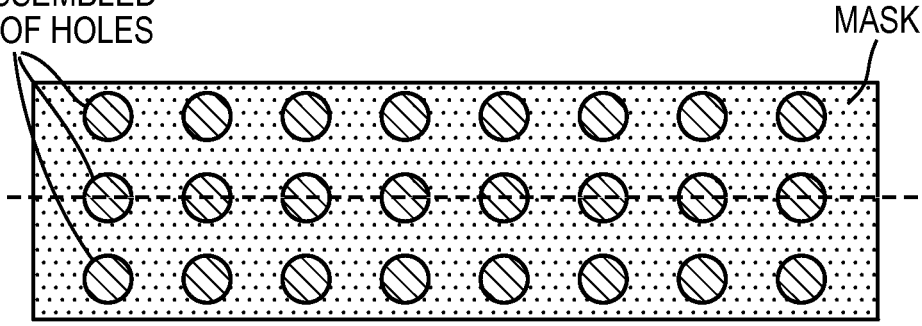
Figure 7B:
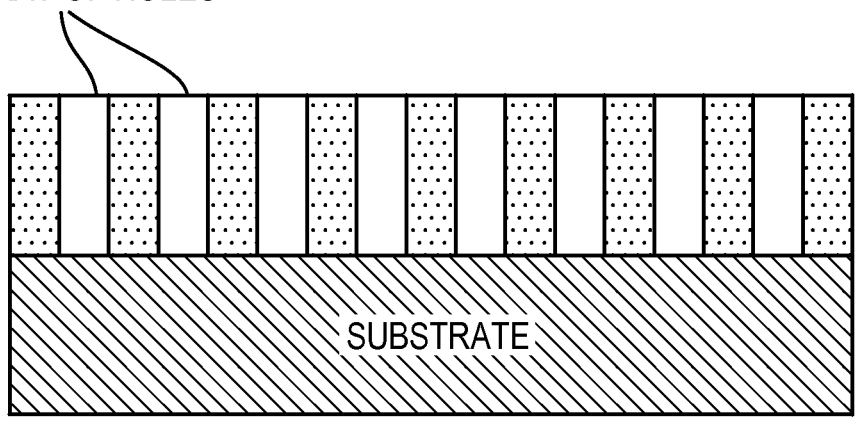
Figure 7C:
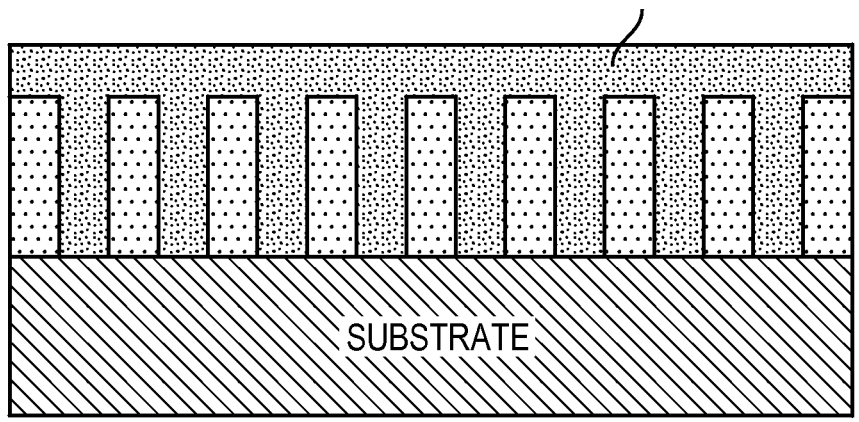

Further, referring to FIGS. 7A-7C, in some embodiments, the invention focuses on creating large active areas within the heteroepitaxial region by a combination of epitaxial necking and ELO techniques, employing a self-assembled dislocation-blocking mask. Specifically, a dielectric layer defining an array of openings therethrough can be formed using self-assembly techniques, thereby avoiding traditional time-consuming lithography and etch approaches. For an example of how a self-assembled array of vertical openings in an insulator layer could be created on a Si substrate, see an article by Wenchong Hu et al. entitled "Growth of well-aligned carbon nanotube arrays on silicon substrates using porous alumina film as a nanotemplate," published in Applied Physics Letters, Vol. 79, No. 19 (2001) and incorporated herein by reference, describing how anodic oxidation of the aluminum can be used to create a self-assembled array of vertical openings similar to that shown in FIG. 7A-7B, where the insulator is alumina ($Al_2O_3$). The process described by Hu et al., however, leaves a small residual layer of alumina at the bottom of each hole. To remove this residual layer, an anisotropic dry etch (much higher etch rate normal to the wafer surface than parallel to the wafer surface) could be performed, exposing the silicon which is the 'seed' for subsequent epitaxial necking. Then, heteroepitaxial regions are selectively grown within and out of the openings, at least until resulting overgrowth regions coalesce. Depending on lateral dimensions of the aperture, degree of mismatch, and rigidity of sidewall oxide, either plastic or elastic relaxation of the heteroepitaxial "pillars" may dominate. The resulting heteroepitaxial layer is then planarized (FIG. 7C), e.g. via CMP, and the active-area, substantially exhausted of threading dislocations and/or other dislocation defects is used for device fabrication.

Figure 8:
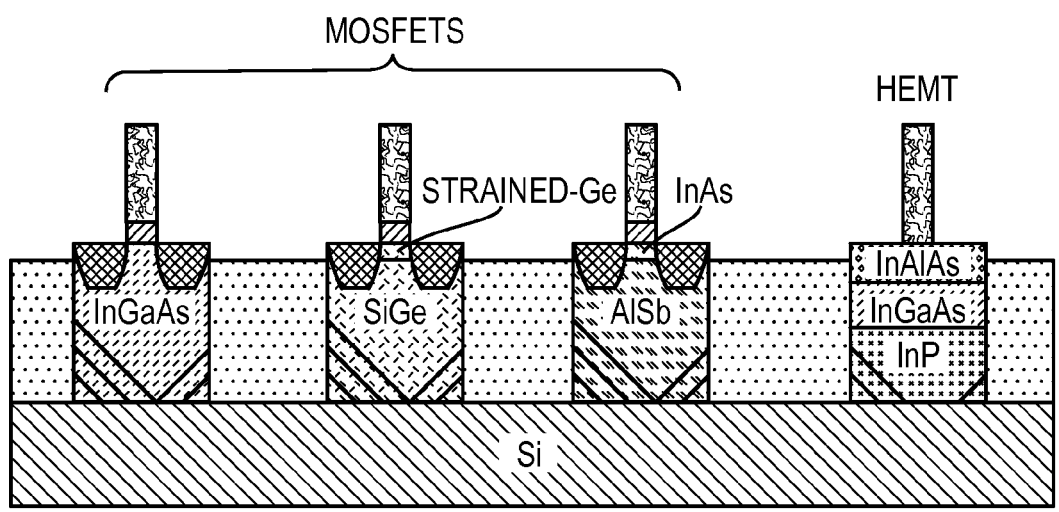
FIGS. 8-10 depict various applications of dislocation blocking techniques for semiconductor devices, according to various embodiments of the invention.
Figure 9:
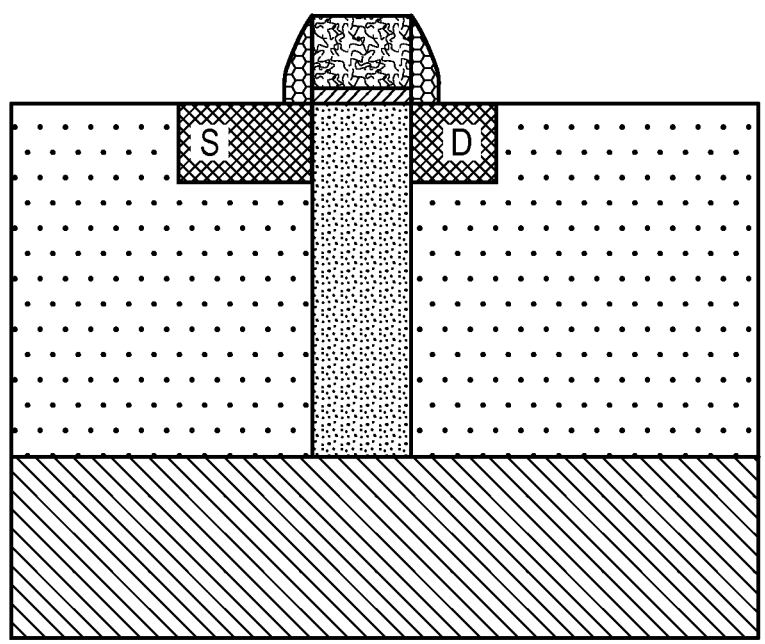

FIGS. 8-10 depict various applications of dislocation-blocking techniques according to various embodiments of the invention for fabrication of CMOS devices. FIG. 8 shows various device structures disposed over regrowth or overgrown regions fabricated according to the invention, such as MOSFET devices including Ge, InGaAs, strained Ge/SiGe and other materials, or HEMT devices, e.g. including InGaAs. The starting substrate can be Si substrate or SOI/SSOI substrate. In one example, n-FET and p-FET digital devices are fabricated on a SSOI substrate, while RF/analog devices are fabricated over a Ge region grown over the Si substrate using the approaches discussed above. By integrating advanced materials into Si substrate, electron and hole mobility can be enhanced significantly. In order to avoid the deleterious effects of dislocations defects on such FET devices, the channel, source, and drain region should be confined to an upper region of regrowth or overgrown material which is substantially defect-free. As discussed in detail above, blocking of the threading dislocations and other defects is promoted by geometry and orientation of the mask and/or the image force. In many embodiments, the image force alone is sufficient to cause the upper region of the regrowth or overgrown material to be substantially exhausted of threading dislocations and other dislocation defects.

Furthermore, still referring to FIG. 8, a wide bandgap material which will suppress junction leakage (such as AlSb) can be used for initial growth, followed by a material with high electron mobility for the FET channel (such as InAs). In this embodiment, preferably, the two semiconductor materials have similar lattice constants, to reduce the possibility of dislocations forming at the interface between them. Also in this embodiment, the growth of the wide bandgap material may be followed by a planarization step so that its surface is substantially planar with the top of the dislocation blocking mask; subsequently a thin layer of the high-mobility material can be grown to accommodate the MOS channel. Preferably, the bottom of the FET junctions is disposed within the wide bandgap region to suppress junction leakage.

FIG. 9 depicts another application of the dislocation-blocking techniques according to various embodiments of the invention in CMOS. This method allows the Ge/III-V necking technique to be used in relatively large CMOS devices. When applying the dislocation-blocking technique in a CMOS device as in the embodiment of FIG. 8, the length of device active region $L_{active}$ should be small enough to satisfy the aspect ratio requirement discussed above. $L_{active}$, which includes source/drain lengths as well, is, however, much larger than the device channel length Lg. The embodiment shown in FIG. 9 addresses a situation where Ge or GaAs growth is performed at a narrow channel region only; source/drain materials are then deposited separately. This approach allows for Ge or GaAs growth techniques to be applied to much larger devices, for example, 90 nm node CMOS devices instead of 22 nm node devices. This channel-only Ge/III-V dislocation-blocking approach may also be combined with other desirable source/drain engineering techniques, such as raised source/drain techniques, Schottky source/drain approaches, or the use of materials on the source/drain region different from the material in the channel region for source/drain dopant/conductivity optimization. The quasi source/drain "on-insulator" structure also reduces the junction capacitance. Proper deposition of source/drain materials may also introduce localized strain in the channel region for mobility enhancement purpose. The approach discussed above can be applied to pre-defined small channel regions only. The epitaxial deposition in the source/drain regions may be defective, but as long as the dislocations terminate on the sidewalls of the narrow channel region, the defect density in source/drain is acceptable.

Figure 10A:
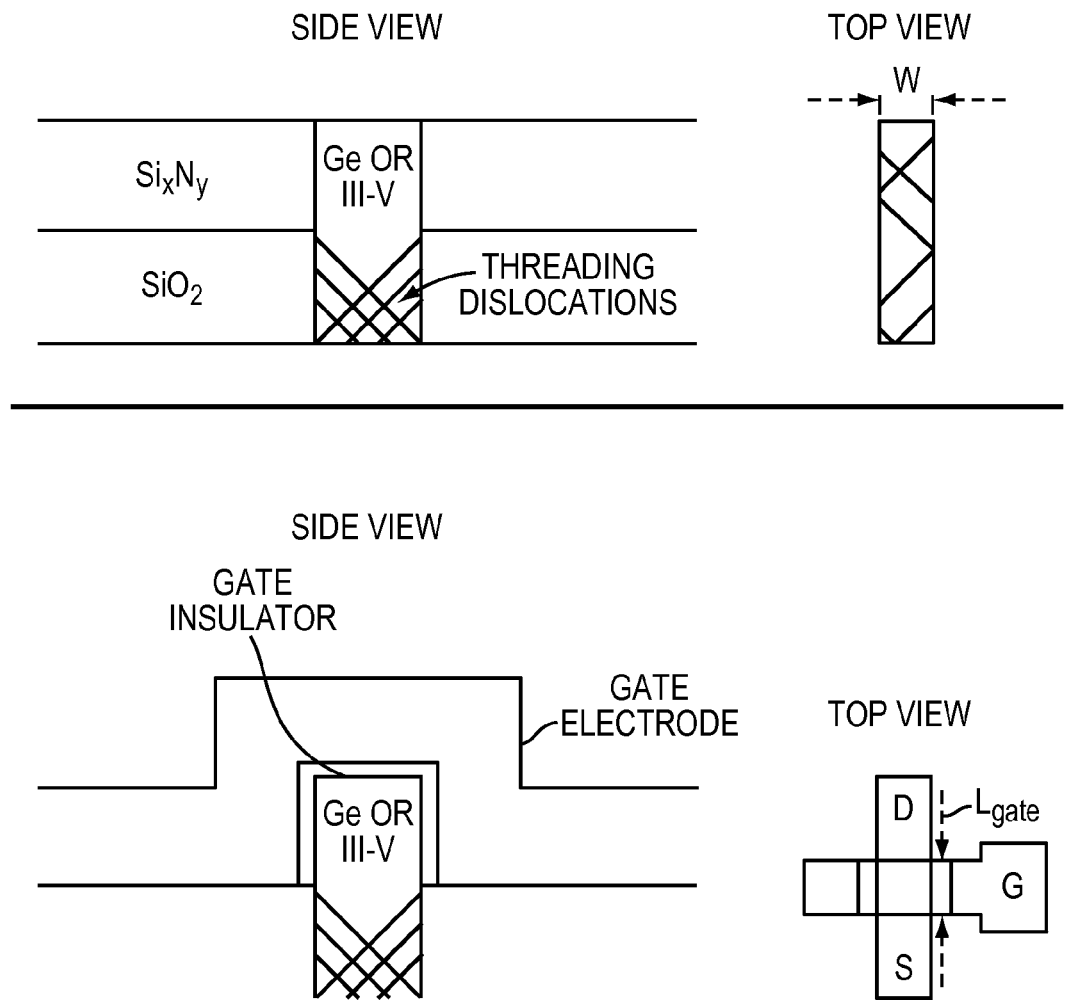
Figure 10B:
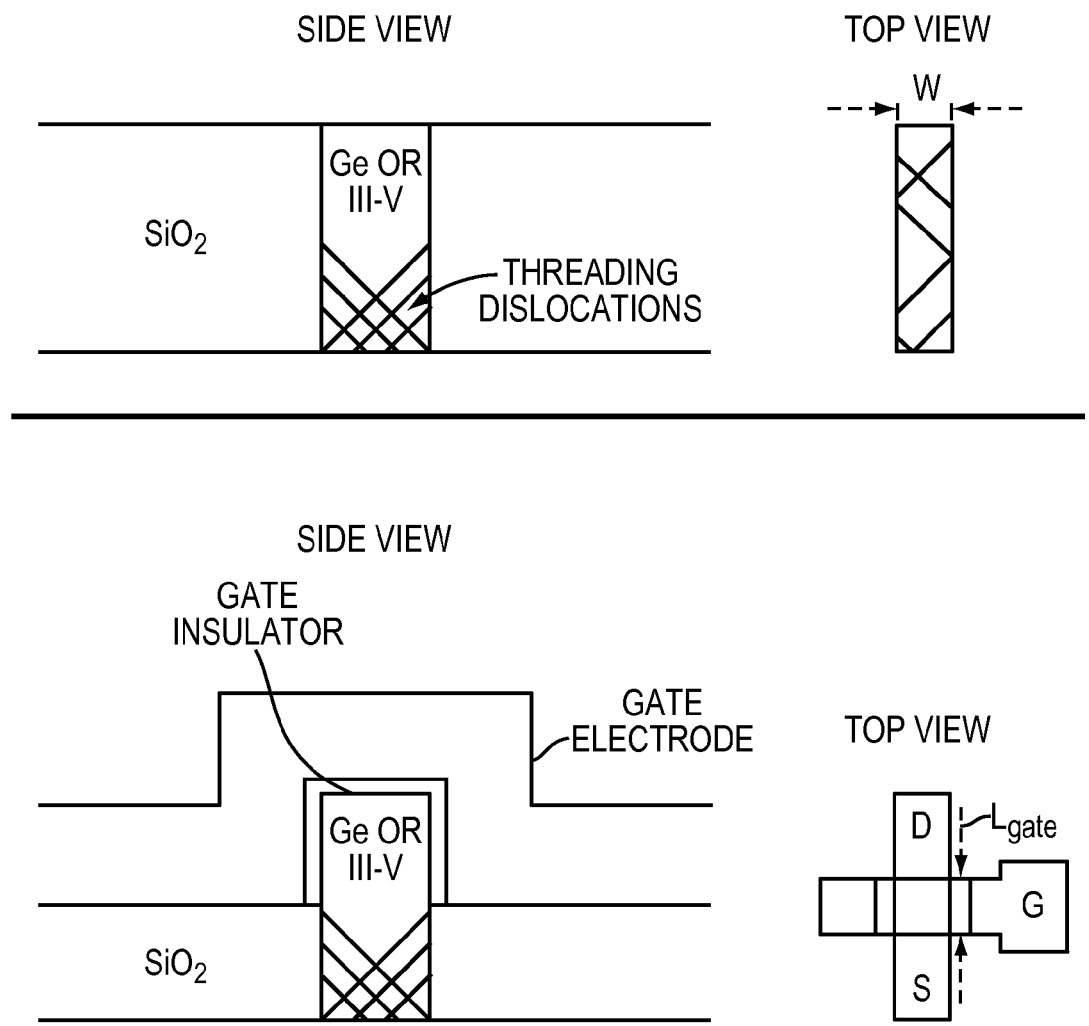

Besides the conventional planar MOSFETs, the dislocation-blocking technique of the invention can also be used to fabricate non-planar FETs. As mentioned above, blocking of the threading dislocations and other defects is promoted by geometry and orientation of the mask and/or the image force. In many embodiments, the image force alone is sufficient to cause the upper region of the regrowth or overgrown material to be substantially exhausted of threading dislocations and other dislocation defects. FIGS. 10A and 10B show body-tied finFETs or tri-gate transistor structures which takes the advantage of the vertical shape of the lattice-mismatched material. One exemplary method includes depositing or growing an oxide layer, followed by depositing a nitride layer, masking and etching a trench of width w<0.5 h; (the trench orientation may be in a <110> direction, so all the threading dislocations along <110> directions (which will lie at an angle of 45-degrees to the surface of the first semiconductor material) will intersect sidewalls within the height of h); selectively growing Ge or III-V in the trench; chemical-mechanical polishing to remove the portion of selective growth outside of the trench; selectively removing nitride, which results in fin structures; and then growing and/or depositing insulator material around the fin structures; followed by depositing, masking and etching gate electrodes and ion implantation to create source/drain regions. A second exemplary method includes depositing or growing an oxide layer, masking and etching a trench of width w<0.5 h; selectively growing Ge or III-V in the trench; chemical-mechanical polishing to remove the portion of selective growth outside of the trench; selectively removing a portion of the oxide, which results in fin structures; and then growing and/or depositing insulator material around the fin structures; followed by depositing, masking and etching gate electrodes and ion implantation to create source/drain regions.

Figure 11:
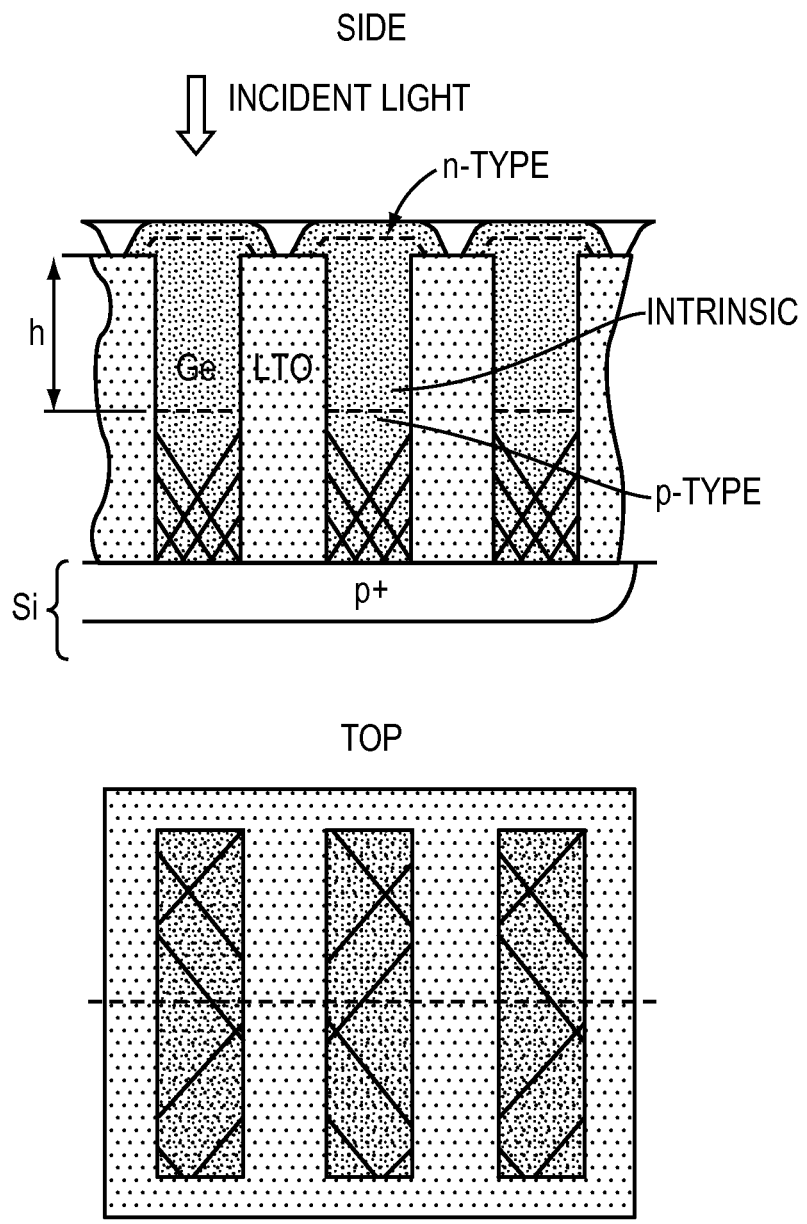
FIGS. 11-12 depict Ge or III-V photodetector integration into Si substrate according to particular embodiments of the invention.
Figure 12:
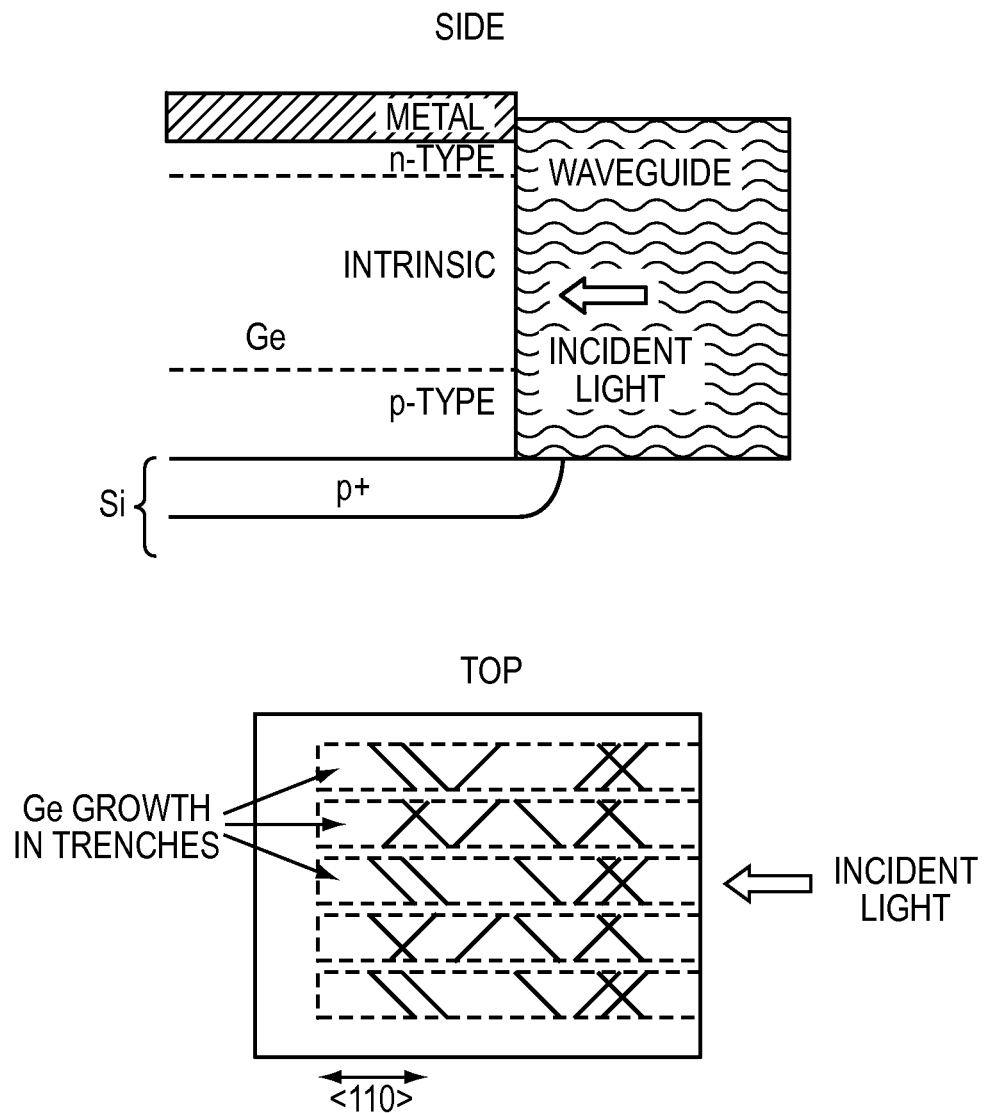

Besides FET devices, the dislocation-blocking techniques of the invention can also be used to fabricate other types of devices, such as optical devices. Referring to FIGS. 11-12, in some embodiments, Ge or III-V photodetectors are integrated into a Si substrate using such techniques. In an exemplary embodiment shown in FIG. 11, a lower contact is implanted on a Si substrate to form p+-type region; low-temperature oxide is deposited; apertures or trenches are etched through the low-temperature oxide layer to explore the Si substrate; and Ge or III-V materials are selectively grown on the apertures or trenches with in-situ doping until past the defect regions (p-type). Further, epitaxial growth continues until the thickness is sufficient to allow for desirable levels of absorption of incident light, and then the top layer is implanted to form an n-type region. In another configuration, the light comes from the side (e.g. from in-plane waveguide) instead of from the top, as shown in FIG. 12. This allows light detection to occur in-plane with the wafer surface and also to allow growth thickness to be independent of absorption depth.

Figure 13A:
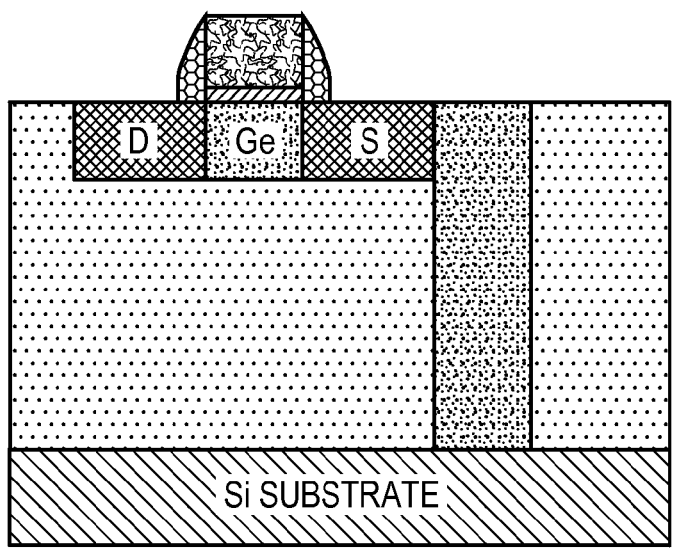
FIGS. 13A-13C depict semiconductor heterostructures employing dislocation-blocking techniques according to alternative embodiments of the invention.

In various embodiments described above, the dislocation-blocking is performed in a vertical direction. FIG. 13A shows an alternative embodiment where the dislocation-blocking may conduct in a lateral direction, for example from the source or drain region. Therefore, the device can be an SOI structure. In one embodiment, the gate oxide and gate stack can be formed first, before the dislocation-blocking growth under the gate, using a channel-replacement-type process. This approach addresses the self-alignment issue and any surface roughness issues.

Figure 13B:
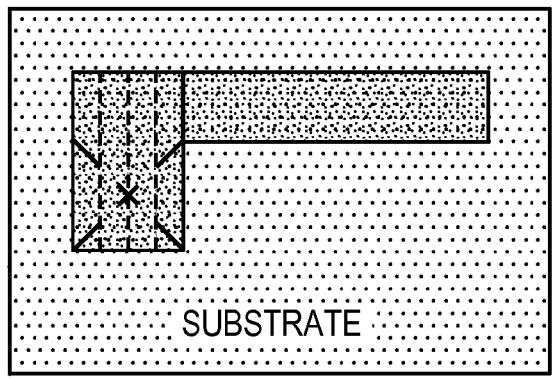

FIG. 13B shows another method which allows dislocations be terminated for a large size epitaxial area. The method includes two steps of epitaxial growth, which take different growth directions, so that the dislocations in one direction terminate at the sidewall during the first epitaxial growth, and the dislocations in another direction, which may have large device dimensions, can terminate on the sidewall when the epitaxial growth changes the direction.

Figure 13C:
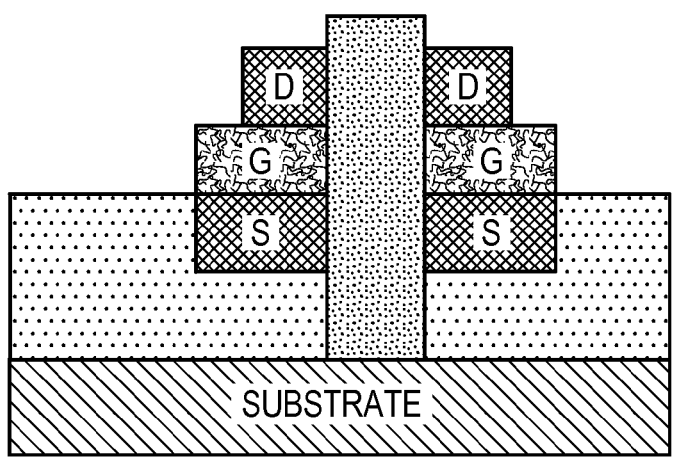

Conventional Ge/III-V necking forms crystal material in the vertical direction. Therefore, when building planar MOS or finFET type devices on that crystal, the device is typically a bulk-type or body-tied, not an "on-insulator" structure. Bulk-type of Ge or GaAs FET may exhibit large junction leakage and poor short-channel effect control. One solution is to build the device vertically instead of parallel to horizontal surface. FIG. 13C shows one embodiment of such structure: a vertical-channel FET, which incorporates the benefits that a vertical FET has, for example, SCE control, better scalability, etc. Another approach is to epitaxially grow an oxide layer that is lattice-matched to the second semiconductor material during selective deposition of the second semiconductor material. As result, there is an oxide layer within the regrowth region underlying a portion thereof subsequently used for device fabrication, as discussed in more detail in co-pending U.S. patent application Ser. No. 11/000,566 by Currie, incorporated herein by reference.

Figure 14A:
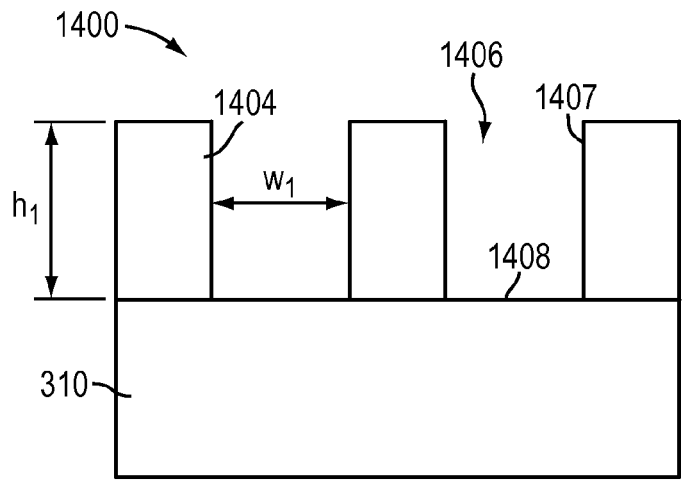
FIGS. 14-16 depict a method of trapping defects by forming grooves in a semiconductor substrate in accordance with various embodiments of the invention.

FIGS. 14-16 illustrate a method, in accordance with embodiments of the current invention, for reducing defects in lattice-mismatched semiconductor heterostructures by forming a recess or groove in a substrate, and also illustrate devices formed in accordance with the method. FIG. 14A shows a semiconductor structure 1400 that includes a substrate 310 and a dielectric layer 1404 disposed thereover. As discussed previously, with reference to FIGS. 3A-3B, the substrate 310 may include, or consist essentially of, a first semiconductor material, such as, for example, a group IV element, e.g., germanium or silicon. The first semiconductor material may be crystalline. The substrate 310 may be, for example, a bulk silicon wafer, a bulk germanium wafer, a semiconductor-on-insulator (SOI) substrate, or a strained semiconductor-on-insulator (SSOI) substrate. In one embodiment, the substrate 310 includes or consists essentially of (100) silicon. The substrate 310 may include a material having a first conductivity type, e.g., n- or p-type, such as n$^+$ Si.

The dielectric layer 1404 may be formed over the substrate 310. The dielectric layer 1404 may include or consist essentially of a dielectric material, such as silicon nitride or silicon dioxide ($SiO_2$). The dielectric layer 1404 may be formed by any suitable technique, e.g., thermal oxidation or plasma-enhanced chemical vapor deposition (PECVD). In some embodiments, the height $h_1$ of the dielectric layer 1404 may be in the range of, e.g., 25-1000 nm. In a preferred embodiment, the height $h_1$ is approximately 600 nm.

An opening or trench 1406 may be formed in the dielectric layer 1404, exposing a portion 1408 of the surface of the substrate 310. More than one opening 1406 may be formed, and each opening 1406 may have a height equal to the height of the dielectric layer, e.g., height $h_1$, and a width $w_1$. The opening(s) 1406 may be created by forming a mask, such as a photoresist mask, over the substrate 310 and the dielectric layer 1404. The mask may be patterned to expose a portion of the dielectric layer 1404. The exposed portion of the dielectric layer 1404 may be removed by, for example, reactive ion etching (RIE) to define the opening 1406. The opening 1406 may be defined by at least one sidewall 1407. In one embodiment, the opening 1406 is formed within the substrate 310, and the dielectric sidewall 1407 is formed within the opening 1406.

The opening 1406 may be substantially rectangular in terms of cross-sectional profile, a top view, or both. With respect to a top view, the width $w_1$ may be smaller than the length $l_1$ (not shown) of the opening. For example, the width $w_1$ of the opening 1406 may be less than about 500 nm, e.g., about 10-500 nm, and the length $l_1$ of the opening 1406 may exceed $w_1$. The ratio of the height $h_1$ of the opening to the width $w_1$ of the opening 1407 may be ≥0.5, e.g., ≥1. The opening sidewall 1407 may not be strictly vertical.

Figure 14B:
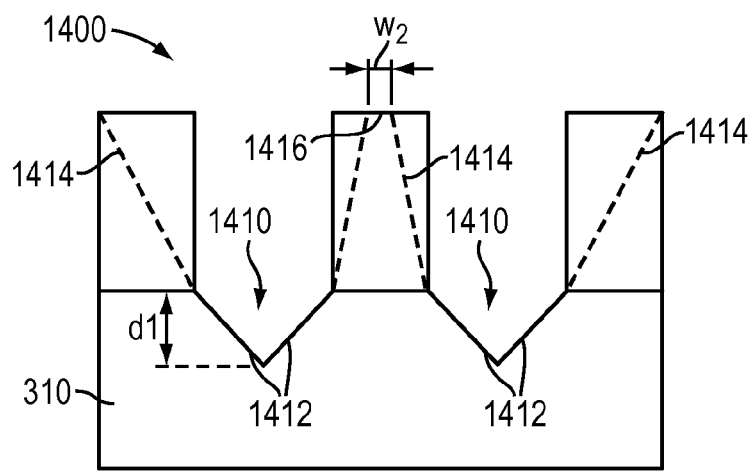

Referring to FIG. 14B and also to FIG. 5A, a portion 1408 of the surface of the substrate 310 may be removed by, e.g., etching, to form a recess or groove 1410. The recess 1410 may be formed by wet etching the substrate 310 with, for example, KOH or NaOH, or by dry etching, such as plasma etching. In one embodiment, the surface 1412 in the recess 1410 features non-(100) surfaces, such as (111) semiconductor surfaces, e.g., (111) Si surfaces. The recess 1410 may have a maximum depth d corresponding to its deepest point farthest from the substrate surface and may have a v-shaped profile. The ratio of the height of the dielectric layer 1404 plus the maximum depth of the recess 1410 to the width of the opening may be greater than or equal to one, i.e., $(h_1+d_1)/w_1>1$.

In one embodiment, and with reference also to FIG. 6H, another portion of the dielectric layer 1404 may be partially removed with, for example, a hydrofluoric acid etch. A portion of the dielectric layer 1404 distal to the substrate 310 may be removed at a faster rate than a portion proximate the substrate 310, creating a non-vertical sidewall 1414. The remaining portion of the dielectric layer 1404 may resemble an inverted V when viewed in cross-section. In one embodiment, the sidewall 1414 is substantially parallel to the surface 1412 of the opening 1410. In another embodiment, a horizontal portion 1416 of the dielectric layer 1404 remains after the etch, and the width $w_2$ of the horizontal portion 1416 is much less than the width w of the opening 1406.

Figure 14C:
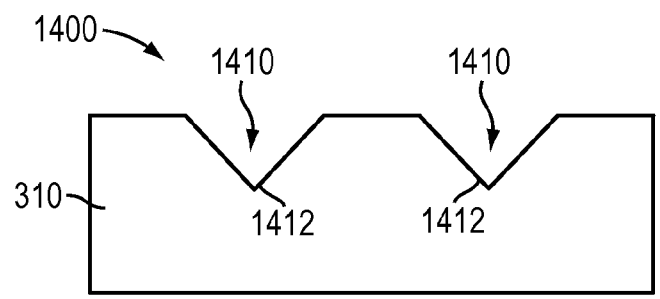

FIG. 14C shows an alternative embodiment of the current invention in which the dielectric layer 1404 is removed from the substrate 310 after the formation of the recess(es) 1410. The dielectric layer 1404 including $SiO_2$ may be removed with, for example, a hydrofluoric acid etch. This embodiment of the invention may be suitable for the growth of III-nitride semiconductor layers or layers of other semiconductor materials having hexagonal lattice structures. Any dislocation defects that form in a III-nitride material (or other suitable material) deposited on the surface of the substrate 310 may form perpendicularly to the opening surfaces 1412, rather than vertically, as the defects may typically form. The non-vertical formation of the defects may, therefore, create defect-free regions in the deposited material. In an alternative embodiment, the recesses 1410 improve the formation of GaAs (or other semiconductor materials having cubic or zinc blende lattice structures) heteroepitaxial structures.

Figures 15A, 15B:
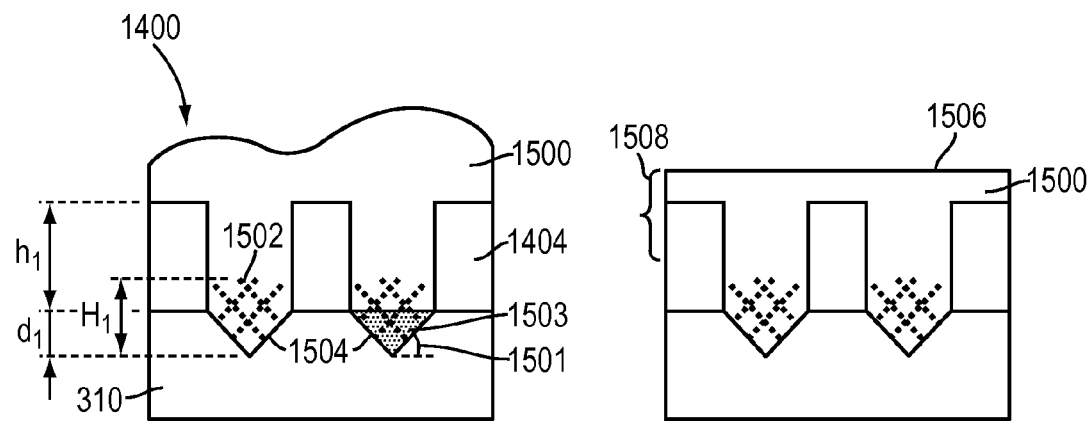

FIG. 15A illustrates an embodiment of the current invention in which the dielectric layer 1404 is not removed from the substrate 310 after the formation of the recess(es) 1410. A second crystalline semiconductor material 1500, which is lattice-mismatched to the first crystalline semiconductor material in the substrate 310, may be formed within the recess 1410. In one embodiment, the second crystalline semiconductor material 1500 may be further formed within the opening 1406. The second crystalline semiconductor may be formed by, for example, metal-organic chemical vapor deposition (MOCVD) or molecular-beam epitaxy (MBE). The second crystalline semiconductor material 1500 may be a III-V material, such as GaAs or InP, a type-IV material, such as Ge or SiGe, or an alloy or mixture including any of these materials, such as InGaP. In one embodiment, an etch-stop layer (not shown), including a wide band-gap material, may be formed on top of the second crystalline semiconductor material 1500. Dislocation defects 1502 may form in the second crystalline semiconductor material 1500 near the interface 1504 between the substrate 310 and the second crystalline semiconductor material 1500. The defects may form along the (111) direction, which may be parallel to the surface 1412 of the substrate 310. The defects may terminate at a height $H_1$ above the deepest point of the recess 1410. In one embodiment, the defects terminate within the recess 1410, and $H_1 \leq d_1$. In another embodiment (e.g., the embodiment illustrated in FIG. 15A), the defects terminate within the opening 1406, and $H_1 \leq h_1 + d_1$. In a third embodiment, the defects terminate at a height $H_1$ that is less than or equal to the width $w_1$.

The recess 1410 may effectively increase the height h of the opening 1406. The surfaces 1412 along the interface 1504 may define an angle 1501 with the horizontal of approximately 57 degrees. The depth d may thus be equal to tan (57°)×$w_1$/2, and the effective height may be equal to $h_1$+tan (57°)×$w_1$/2. The height $h_1$ may be effectively increased regardless of the material to be grown in the opening 1406. In one embodiment, the recess 1410 allows a reduction in the height $h_1$ because the effective increase of $h_1$ may cause any dislocation defects to terminate at a lower height above the substrate 310.

In one embodiment, the second crystalline semiconductor material 1500 does not extend above the height h of the dielectric layer 1404. In an alternative embodiment, the second crystalline semiconductor material 1500 extends above the height h of the dielectric layer 1404, and may coalesce with the second crystalline semiconductor material grown in a neighboring opening 1406 to form a single layer of the second crystalline semiconductor material 1500 above the dielectric layer 1404.

In one embodiment, a buffer layer 1503, comprising a third crystalline semiconductor material, is formed between the second crystalline semiconductor material 1500 and the substrate 310. The buffer layer may be formed on the surface 1412 of the substrate 310, and extend approximately up to the dielectric layer 1404. In another embodiment, the buffer layer 1503 is confined to the recess 1410. The boundary between the second 1500 and third 1503 crystalline semiconductor materials may be proximate the boundary defined by the interface between the exposed portion of the substrate 310 and the dielectric sidewall 1407. The buffer layer 1503 may be used to facilitate the formation of the second crystalline semiconductor material 1500 if there is a large difference between the lattice constants of the second crystalline semiconductor material 1500 and of the substrate 310. For example, the substrate 310 may include Si and the second crystalline semiconductor material 1500 may include InP, so that the two materials differ in lattice constants by approximately eight percent. In this example, GaAs may be used as the buffer layer, because its lattice constant differs from that of both Si and InP by approximately four percent. In another embodiment, Ge or another material having a lattice mismatch to the first and/or second crystalline semiconductor materials of less than eight percent may be used as a buffer layer.

In one embodiment, the buffer layer 1503 may include a constant concentration of the third crystalline semiconductor material, or the concentration may vary such that the lattice constant of the buffer layer 1503 is closer to that of the substrate 310 at the bottom of the buffer layer and closer to that of the second crystalline semiconductor material 1500 near the top of the buffer layer. In another embodiment, multiple buffer layers may be used. The use of one or more buffer layers may allow the formation of one or more heteroepitaxial material layers with large lattice-constant mismatches, while reducing the height h of the dielectric layer 1404 and/or depth d of the recess 1410. The heteroepitaxial material layers may be formed inside the openings 1406 or above the dielectric layer 1404.

FIG. 15B illustrates that, in one embodiment, the second crystalline semiconductor material 1500 may be planarized by, for example, CMP. A substantially smooth surface 1506 may be formed as a result of the planarization. The upper portion 1508 of the second crystalline semiconductor material 1500 may be substantially free of defects.

Figures 15C, 15D:
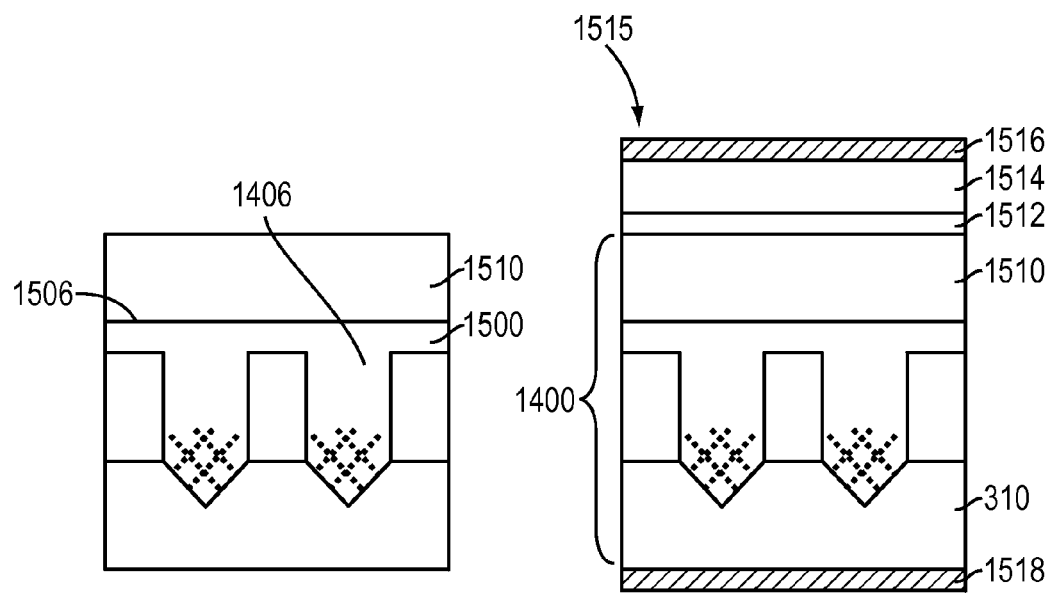

FIG. 15C shows, in one embodiment of the current invention, a device structure 1510 formed on the surface 1506 of the second crystalline semiconductor material 1500. In an alternative embodiment, the device structure 1510 is wholly or partially formed within the opening 1406. The device structure 1510 may include a diode; a transistor; a photonic device such as a photovoltaic device, LED, or laser diode; or any other passive or active semiconductor device. The device structure 1510 may include a single layer of a semiconductor material, or may include more than one layer. Each layer may include or consist essentially of a type-IV semiconductor material or a III-V semiconductor material. In one embodiment, semiconductor devices may be formed in regions of the substrate 310 proximate the device structure 1510.

FIG. 15D depicts, in one illustrative embodiment, a flip-chip wafer bonding process. A thin metal layer 1512 may first be formed on top of the device structure 1510. The thin metal layer 1512 may serve as both an electrical conductor and, in the case where the device structure 1510 is a photonic device, as an optical reflector. In various embodiments, the thin metal layer is approximately 100-200 nm thick and includes or consists essentially of aluminum (for photonic devices emitting visible light) or gold or silver (for infrared light). The semiconductor structure 1400 may then be bonded to a handle wafer 1514 to define a bonded structure 1515. The handle wafer 1514 may include or consist essentially of a semiconductor material such as Si. Finally, a top contact layer 1516 may be formed on a top surface of the handle wafer 1514 and a bottom contact layer 1518 may be formed on a bottom surface of the substrate 310.

Figure 16A:
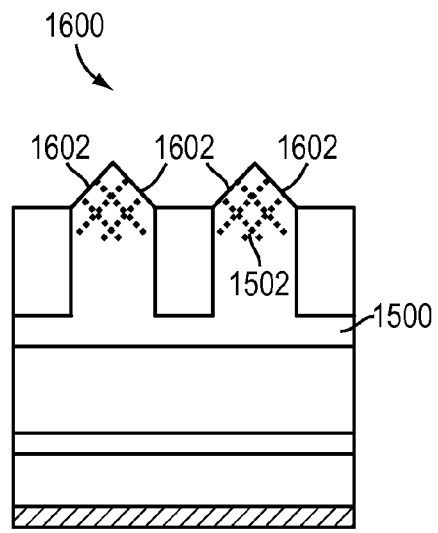

FIG. 16A illustrates a flipped structure 1600, which may be the bonded structure 1520 rotated by 180 degrees. The substrate 310 may be removed with, for example, an etching process, exposing surfaces 1602 of the second crystalline semiconductor material 1500. The defects 1502 may now be near the exposed surfaces 1602 of the second crystalline semiconductor material 1500. The exposed portion of the second crystalline semiconductor material 1500 may include a non-planar surface.

The wafer bonding and flipping process may present advantages during the formation of the second crystalline semiconductor material 1500, because any layer or layers that include the second crystalline semiconductor material 1500 may ultimately be rotated 180 degrees. For example, with reference to FIG. 15A, a layer with a high bandgap may first be deposited on the substrate 310 first, then a layer with a medium bandgap, and finally a layer with a low bandgap. Because the first layer with a high bandgap may require a higher growth temperature than the materials with lower bandgaps, depositing the layers in this order may spare the low bandgap layer from being subjected to the high temperature required for the high bandgap layer. The low bandgap layer may require a lower growth temperature, which the high bandgap material may be better able to withstand. When the device structure 1400, including the illustrative high-, middle-, and low-bandgap layers of the second crystalline semiconductor material 1500, is rotated by the flipping process, the layers may be in an optimal configuration to form a photonic device.

Similarly, doping types in the layer or layers comprising the second crystalline semiconductor material 1500 may be chosen to take advantage of the bonding and flipping process. For example, later processing steps may raise the temperature of the device structure 1400 sufficiently to cause the material of substrate 310, e.g., Si, to diffuse into a first deposited layer or region in the second crystalline semiconductor material 1500. Because the material of substrate 310 may be a n-type dopant in III-V materials such as GaAs and InP, atoms of that material that diffuse into a first deposited p-type doped III-V layer may deleteriously compensate the p-type dopants in that layer. Depositing n-type-doped III-V material on the substrate 310 first, however, may insulate other p-type doped III-V layers against diffusion from the substrate 310.

Figure 16B:
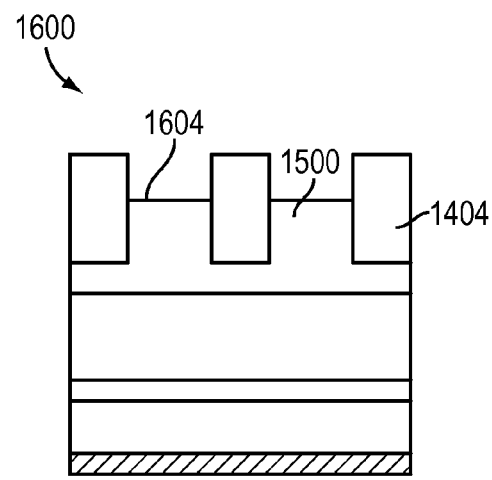

FIG. 16B depicts, in one embodiment, the removal of a portion of the second crystalline semiconductor material 1500 by, for example, an etching process. The dielectric layer 1404 may be relatively unaffected by the etching process. In an alternative embodiment, a portion of the second crystalline semiconductor material 1500 and a portion of the dielectric layer 1404 may be removed simultaneously by, for example, CMP. The portion of the second crystalline semiconductor material 1500 that is removed may contain at least a majority of the defects 1502, leaving the remaining portion of the second crystalline semiconductor material 1500 substantially defect-free. The exposed surfaces 1604 of the second crystalline semiconductor material 1500 may comprise (100) surfaces.

Figure 16C:
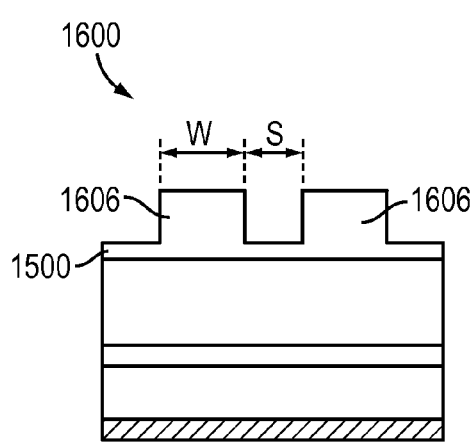

FIG. 16C illustrates the structure 1600, in one embodiment, after the dielectric layer 1404 has been removed. A portion of the dielectric layer 1404 may have previously been removed by CMP, as illustrated in FIG. 16B, in which case the remaining portion of the dielectric layer 1404 may be removed. The exposed second crystalline semiconductor material 1500 may comprise one or more ridges 1606. Each ridge 1606 may have a width w, corresponding to the width w of the openings or trenches 1406. Adjacent ridges 1606 may be separated by a spacing s. The width w and the spacing s may each be less than or equal to a visible light wavelength. In one embodiment, the exposed second crystalline semiconductor material 1500 comprises a two-dimensional array of raised features. The width w and the spacing s of the ridges 1606 in a one- or two-dimensional array may be selected such that the ridges 1606 enhance the light absorption or extraction efficiency of the structure 1600 and/or improve the light beam quality. In one embodiment, the spacing s is approximately equal to the wavelength of the absorbed or emitted light.

Figure 16D:
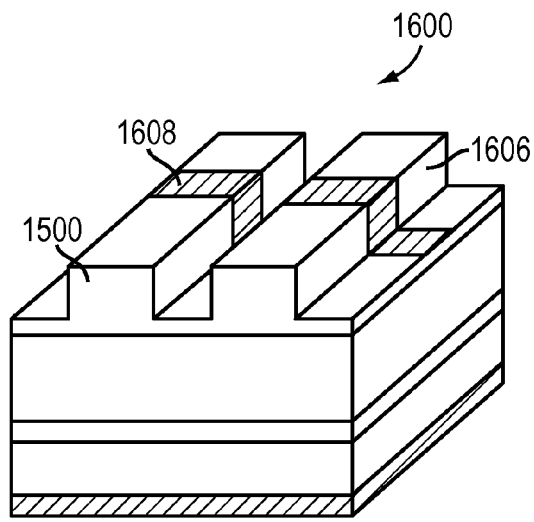

FIG. 16D illustrates another embodiment of the structure 1600. A metal contact 1608, designed in accordance with standard methods, may be formed on the surface of the second crystalline semiconductor material 1500. In one embodiment, the metal contact 1608 conforms to at least one ridge 1606. In an alternative embodiment, the oxide layer 1404 is not removed before the metal contact 1608 is formed. In this embodiment, the top surface of the structure 1600 may be planarized before the metal contact 1608 is formed.

A photonic device 1510, such as a light-emitting diode or a photovoltaic device, formed in accordance with the method described in FIGS. 14-16, may exhibit several advantages. For example, an optical reflection layer may be formed, prior to bonding, on the handle wafer 1514 or on the semiconductor structure 1400. The optical reflection layer may therefore be disposed beneath the photonic device 1510, and may thereby enhance backlight reflection and photon recycling. An LED photonic device 1510 may exhibit increased light-extraction efficiency as a result of the placement, width, and spacing of the ridges 1606 formed on the surface of the crystalline semiconductor material 1500. In addition, the ridges 1606 may enhance the thermal cooling of the structure 1600, thereby improving the thermal depletion of the structure.

Other embodiments incorporating the concepts disclosed herein may be used without departing from the spirit of the essential characteristics of the invention or the scope thereof. The foregoing embodiments are therefore to be considered in all respects as only illustrative rather than restrictive of the invention described herein. Therefore, it is intended that the scope of the invention be only limited by the following claims.

The invention claimed is:

1. A method of forming a structure, the method comprising:
   providing a dielectric sidewall, on a substrate, with a height h, the substrate comprising a first crystalline semiconductor material and a top surface having a first crystal orientation, the dielectric sidewall defining an opening with a first width w exposing a portion of the substrate;

defining, in the exposed portion of the substrate, a recess with a maximum depth d and a recessed surface comprising a second crystal orientation, the recessed surface defining a second width of the recess at the top surface of the substrate and defining a third width of the recess at a depth below the top surface of the substrate, the second width being greater than the third width; and forming, in the recess and adjoining the dielectric sidewall, a second crystalline semiconductor material having a lattice mismatch with the first crystalline semiconductor material, the lattice mismatch creating defects in the second crystalline semiconductor material, the defects terminating at a distance H above a deepest point of the recess, wherein H is less than or equal to h+d.

2. The method of claim 1, wherein H is less than or equal to d.

3. A method of forming a structure, the method comprising:

providing a dielectric sidewall, on a substrate, with a height h, the substrate comprising a first crystalline semiconductor material and a top surface having a first crystal orientation, the dielectric sidewall defining an opening with a first width w exposing a portion of the substrate;

defining, in the exposed portion of the substrate, a recess with a maximum depth d and a recessed surface comprising a second crystal orientation, the recessed surface defining a second width of the recess at the top surface of the substrate and defining a third width of the recess at a depth below the top surface of the substrate, the second width being greater than the third width; and forming, in the recess and adjoining the dielectric sidewall, a second crystalline semiconductor material having a lattice mismatch with the first crystalline semiconductor material, the lattice mismatch creating defects in the second crystalline semiconductor material, the defects terminating at a distance H above a deepest point of the recess, wherein H is less than or equal to w.

4. A method of forming a structure, the method comprising:

providing a dielectric sidewall, on a substrate, with a height h, the substrate comprising a first crystalline semiconductor material and a top surface having a first crystal orientation, the dielectric sidewall defining an opening with a first width w exposing a portion of the substrate;

defining, in the exposed portion of the substrate, a recess with a maximum depth d and a recessed surface comprising a second crystal orientation, the recessed surface defining a second width of the recess at the top surface of the substrate and defining a third width of the recess at a depth below the top surface of the substrate, the second width being greater than the third width; and forming, in the recess and adjoining the dielectric sidewall, a second crystalline semiconductor material having a lattice mismatch with the first crystalline semiconductor material, the lattice mismatch creating defects in the second crystalline semiconductor material, the defects terminating at a distance H above a deepest point of the recess, wherein a ratio of h+d to w is greater than or equal to one.

5. A method of forming a structure, the method comprising:

providing a dielectric sidewall, on a substrate, with a height h, the substrate comprising a first crystalline semiconductor material and a top surface having a first crystal orientation, the dielectric sidewall defining an opening with a first width w exposing a portion of the substrate;

defining, in the exposed portion of the substrate, a recess with a maximum depth d and a recessed surface comprising a second crystal orientation, the recessed surface defining a second width of the recess at the top surface of the substrate and defining a third width of the recess at a depth below the top surface of the substrate, the second width being greater than the third width; and forming, in the recess and adjoining the dielectric sidewall, a second crystalline semiconductor material having a lattice mismatch with the first crystalline semiconductor material, the lattice mismatch creating defects in the second crystalline semiconductor material, the defects terminating at a distance H above a deepest point of the recess, wherein the recess has a v-shaped profile.

6. A method of forming a structure, the method comprising:

providing a dielectric sidewall, on a substrate, with a height h, the substrate comprising a first crystalline semiconductor material and a top surface having a first crystal orientation, the dielectric sidewall defining an opening with a first width w exposing a portion of the substrate;

defining, in the exposed portion of the substrate, a recess with a maximum depth d and a recessed surface comprising a second crystal orientation, the recessed surface defining a second width of the recess at the top surface of the substrate and defining a third width of the recess at a depth below the top surface of the substrate, the second width being greater than the third width; and forming, in the recess and adjoining the dielectric sidewall, a second crystalline semiconductor material having a lattice mismatch with the first crystalline semiconductor material, the lattice mismatch creating defects in the second crystalline semiconductor material, the defects terminating at a distance H above a deepest point of the recess, wherein the first crystal orientation is (100), and the second crystal orientation is not (100).

7. The method of claim 6, wherein the second crystal orientation is (111).

8. A method of forming a structure, the method comprising:

forming an opening in a dielectric layer, the dielectric layer being over a substrate, the substrate comprising a first crystalline material, the opening exposing an exposed surface of a top surface of the substrate;

forming a recess in the substrate in the exposed surface, the recess having a recess sidewall that forms an obtuse angle with the top surface of the substrate; and forming a second crystalline material in the recess and in the opening, the second crystalline material being lattice mismatched with the first crystalline material.

9. The method of claim 8, wherein the lattice mismatch creates defects in the second crystalline material, the defects terminating at a distance above a deepest point of the recess, the distance being less than or equal to a height of the dielectric layer from the top surface of the substrate plus a maximum depth of the recess.

10. The method of claim 8, wherein the lattice mismatch creates defects in the second crystalline material, the defects terminating at a distance above a deepest point of the recess, the distance being less than or equal to a maximum depth of the recess.

11. The method of claim 8, wherein the lattice mismatch creates defects in the second crystalline material, the defects terminating at a distance above a deepest point of the recess, the distance being less than or equal to a width of the opening.

12. The method of claim 8, wherein a ratio of a height of the dielectric layer from the top surface of the substrate plus a maximum depth of the recess to a width of the opening is greater than or equal to one.

13. The method of claim 8, wherein the recess has a v-shaped profile.

14. The method of claim 8, wherein the top surface of the substrate has a first crystal orientation of (100), and the recessed sidewall has a second crystal orientation of not (100).

15. The method of claim 14, wherein the second crystal orientation is (111).

\* \* \* \* \*